US010964806B2

(12) United States Patent
Longobardi et al.

(10) Patent No.: US 10,964,806 B2
(45) Date of Patent: Mar. 30, 2021

(54) GALLIUM NITRIDE TRANSISTOR

(71) Applicant: Cambridge Enterprise Limited, Cambridge (GB)

(72) Inventors: Giorgia Longobardi, Cambridge (GB); Florin Udrea, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 0 days.

(21) Appl. No.: 16/421,774

(22) Filed: May 24, 2019

(65) Prior Publication Data
US 2019/0288101 A1    Sep. 19, 2019

Related U.S. Application Data

(63) Continuation-in-part of application No. PCT/EP2017/079974, filed on Nov. 21, 2017.

(30) Foreign Application Priority Data

Nov. 24, 2016  (GB) ...................................... 1619842

(51) Int. Cl.
*H01L 29/66* (2006.01)
*H01L 29/778* (2006.01)
(Continued)

(52) U.S. Cl.
CPC ...... *H01L 29/7788* (2013.01); *H01L 29/0619* (2013.01); *H01L 29/0634* (2013.01); (Continued)

(58) Field of Classification Search
CPC ..................... H01L 29/4236; H01L 29/66462
See application file for complete search history.

(56) References Cited

U.S. PATENT DOCUMENTS 5,530,272 A    6/1996 Kudo
7,439,555 B2  10/2008 Beach
(Continued)

FOREIGN PATENT DOCUMENTS

CN        102629624 B    8/2012

OTHER PUBLICATIONS

International Search Report and Written Opinion from International Application No. PCT/EP2017/079974, dated Jun. 15, 2018, 20 pages.
(Continued)

*Primary Examiner* — Matthew L Reames
(74) *Attorney, Agent, or Firm* — Tucker Ellis LLP

(57) ABSTRACT

A heterojunction power device includes a substrate; a III-nitride semiconductor region over the substrate; a source operatively connected to the semiconductor region; a drain operatively connected to the semiconductor region; a gate between the source and drain and over the semiconductor region. The source is in contact with a first portion located between the source and gate and having a two dimensional carrier gas. The drain is in contact with a second portion located between the drain and gate and having a two dimensional carrier gas. At least one of the first and second portions has a trench having vertical sidewalls and formed within the semiconductor region; mesa regions extend away from each sidewall of the trench. The two dimensional carrier gas is located alongside the mesa regions and the trench. At least one of the source and drain is in contact with the respective two dimensional carrier gas.

16 Claims, 17 Drawing Sheets

(51) Int. Cl.
  *H01L 29/20* (2006.01)
  *H01L 29/205* (2006.01)
  *H01L 29/423* (2006.01)
  *H01L 29/06* (2006.01)
  *H01L 29/08* (2006.01)

(52) U.S. Cl.
  CPC ...... *H01L 29/0657* (2013.01); *H01L 29/2003* (2013.01); *H01L 29/205* (2013.01); *H01L 29/4236* (2013.01); *H01L 29/66462* (2013.01); *H01L 29/7781* (2013.01); *H01L 29/7786* (2013.01); *H01L 29/7787* (2013.01); *H01L 29/7789* (2013.01); *H01L 29/0847* (2013.01)

(56) References Cited

U.S. PATENT DOCUMENTS

| | | | |
|---|---|---|---|
| 8,044,434 | B2 | 10/2011 | Ohta |
| 8,704,273 | B2 | 4/2014 | Okamoto |
| 2010/0252816 | A1 | 10/2010 | Ko |
| 2011/0068371 | A1 | 3/2011 | Oka |
| 2012/0305987 | A1 | 12/2012 | Hirler |
| 2014/0091310 | A1 | 4/2014 | Jeon |
| 2015/0349124 | A1 | 12/2015 | Lu |
| 2015/0357472 | A1* | 12/2015 | Huang ............ H01L 29/7851 257/20 |
| 2016/0005849 | A1* | 1/2016 | Li .................. H01L 29/7789 257/24 |
| 2017/0243967 | A1* | 8/2017 | Kim ................ H01L 29/7786 |

OTHER PUBLICATIONS

J. K. Mishra, P. Parikh, and Y.-F. Wu, "AlGaN/GaN HEMTs—an overview of device operation and applications.," in Proceedings-IEEE 90.6 (2002):1022-1031., 2002, 36 pages.

Y. Cai, Zhou, Y., Chen, K. J., Lau, K. M., "High-performance enhancement-mode AlGaN/GaN HEMTs using fluoride-based plasma treatment.," IEEE Electron Device Letters, vol. 26, pp. 435-437, 2005, 3 pages.

W. Saito, Takada, Y., Kuraguchi, M., Tsuda, K., & Omura, I., "Recessed-gate structure approach toward normally off high-voltage AlGaN/GaN HEMT for power electronics applications.," IEEE Transactions on electron devices, vol. 53, pp. 356-362, 2006, 7 pages.

Y. Uemoto, Masahiro Hikita, Hiroaki Ueno, Hisayoshi Matsuo, Hidetoshi Ishida, Manabu Yanagihara, Tetsuzo Ueda, Tsuyoshi Tanaka, and Daisuke Ueda, "Gate injection transistor (GIT)—A normally-off AlGaN/GaN power transistor using conductivity modulation," IEEE Transactions on Electron Devices, vol. 54, pp. 3393-3399., 2007, 7 pages.

T. Oka, and Tomohiro Nozawa, "AlGaN/GaN recessed MIS-gate HFET with high-threshold-voltage normally-off operation for power electronics applications.," IEEE Electron Device Letters vol. 29, pp. 668-670, 2008, 3 pages.

S. Yang, Shenghou Liu, Cheng Liu, Mengyuan Hua, and Kevin J. Chen., "Gate stack engineering for GaN lateral power transistors" Semiconductor Science and Technology vol. 31, p. 024001, 2015, 11 pages.

P. Moens, Vanmeerbeek, P., Banerjee, A., Guo, J., Liu, C., Coppens, P., Salih, A., Tack, M., Caesar, M., Uren, M.J. and Kuball, M., "On the impact of carbon-doping on the dynamic Ron and off-state leakage current of 650V GaN power devices," in 27th International Symposium on Power Semiconductor Devices & IC's (ISPSD), Hong Kong, 2015, pp. 37-40, 4 pages.

W. Saito, Noda, T., Kuraguchi, M., Takada, Y., Tsuda, K, Saito, Y., Omura, I. and Yamaguchi, M.i, "Effect of buffer layer structure on drain leakage current and current collapse phenomena in high-voltage GaN-HEMTs.," IEEE Transactions on Electron Devices, vol. 56, pp. 1371-1376, 2009, 6 pages.

K. Ohi, and Tamotsu Hashizume., "Drain current stability and controllability of threshold voltage and subthreshold current in a multi-mesa-channel AlGaN/GaN high electron mobility transistor," Japanese Journal of Applied Physics, vol. 48, p. 08100, 2009, 5 pages.

B. Lu, Elison Matioli, and Tomás Palacios, "Tri-gate normally-off GaN power MISFET," IEEE Electron Device Letters vol. 33, pp. 360-362, 2012, 3 pages.

Combined Search and Examination Report from corresponding United Kingdom Application No. GB 1619842.6, dated Mar. 28, 2017, 6 pages.

B. J. Baliga, "Advanced High Voltage Power Device Concepts", Springer, 2011, 4 pages.

* cited by examiner

GALLIUM NITRIDE TRANSISTOR

RELATED APPLICATION DATA

This application is a continuation-in-part of PCT/EP2017/079974, filed Nov. 21, 2017, and claims the benefit of United Kingdom Patent Application No. 1619842.6, filed Nov. 24, 2016, the disclosures of which are incorporated herein by reference in their entireties.

FIELD OF THE INVENTION

The present invention relates to a Gallium Nitride (GaN) based semiconductor device, particularly but not exclusively, to a GaN transistor in which a two-dimensional carrier gas constituting a channel of the transistor has a three-dimensional folded geometry.

BACKGROUND

Power semiconductor devices are the core of all power electronics systems. It has been evaluated that at least 50% of the electricity consumption in the world occurs in systems that contain power devices [1]. Two main quantities characterize power devices in terms of the range of applications. These are (i) current rating in an on-state operation; (ii) breakdown voltage in an off-state operation. Another parameter is the on-state resistance, Ron, as this directly associates the power device to its on-state power consumption. The lower the Ron the lower the power conduction losses are. A trade-off exists between the maximum voltage sustainable in the off-state (i.e. breakdown voltage, BV) and on-state resistance. Consequently, devices with a relatively high breakdown voltage suffer from a high on-state resistance. So far, silicon (Si) has been the main semiconductor of choice for power devices. Given its versatility and ease of manufacture, Si has been adopted in power device technologies, particularly to cover a wide range of power applications from few volts to 10 kV of breakdown voltage. However, Si has a small bandgap (Eg=1.12 eV) which leads to it being able to sustains less volts per centimetre (cm) before failure (critical Electric field) than a wide bandgap semiconductor device. This results in a waste of semiconductor area for a rated voltage.

Wide bandgap materials, such as Gallium Nitride (GaN), have the benefit to have a higher critical electric field. Furthermore, Aluminium Gallium Nitride (AlGaN)/GaN hetero-structure based devices such as High Electron Mobility Transistors (HEMTs) have been proven to have a much better Ron vs BV trade-off compared to equivalent silicon counterparts. This is due to main properties: (i) their piezoelectric nature which gives very high charge density (e.g. 1e13 cm$^{-2}$) confined at the AlGaN/GaN interface, and (ii) the above mentioned higher critical electric field (~3 MV/cm).

A basic AlGaN/GaN HEMT (also known as Heterostructure Field-Effect-Transistor (HFET) or Modulation FET (MODFET)) is based on a conductive channel formed at the AlGaN/GaN interface being formed on a horizontal plane and connecting to ohmic source and drain contacts. A Schottky gate contact placed on top of the hetero-structure along the source-to-drain distance modulates the charge in the channel [2].

A HEMT structure is schematically shown in FIG. 1 and is a normally-on or Depletion-mode device, i.e. a channel 105 is already formed when zero bias is applied on a gate terminal 110. In power electronics applications normally-off operation is preferable as it is safer and also allows for simple gate drive circuits. Several technologies have been proposed so far to obtain normally-off (or Enhancement Mode) devices. Among these the fluorine-based plasma treated gate [3], recessed gate [4] p-doped gate [5], and insulated gate [6] or combination of these (in [7] a combination of fluorine implantation and partially recessed gate is proposed). These solutions have demonstrated to be effective in guarantying a normally-off operation by depleting the portion of the channel underneath the gate contact 110 at zero bias.

FIG. 2 shows a schematic representation of a HEMT in which an insulated gate technology is used. The insulated-gate technology provides a solution to the normally-on issue as it provides a stable and high value (>1.5V) for the threshold voltage as well as low leakage current through the gate contact. Variations to the basic structure as shown in FIG. 2 featuring a partially recessed insulated gate 205 in the AlGaN layer 215 have been proposed with the aim to improve the channel mobility [7], increase and better control the threshold voltage via the formation of an inversion channel into a p-doped GaN layer 210 along the sidewalls of a trench [8, 9].

GaN-based transistors, independently of the technology used for obtaining normally-on or -off operation, often show poor reliability when biased to high voltages for prolonged periods. This is due to existence of surface and bulk traps which get activated when the off-state high voltage stress is applied on the devices for a prolonged time. As a result, the electrons are captured from the 2DEG layer into the traps leading to a very undesirable increase in the on-state resistance. This is known in the field as 'the current collapse' or dynamic Ron, which is assumed to be higher than the static Ron. Possible solutions to reduce the trapping mechanisms include control of the P-type carbon doping [10], quality and nature of the buffer layer thickness [11], and p-type ohmic contact in the GaN bulk region [12]. No one of these approaches, however, has so far demonstrated a complete 'collapse-free' operation of the GaN devices.

Three-dimensional geometries with periodical trenches within the gate region have been previously proposed for normally-on [13] and normally-off transistors [14]. Both [13] and [14] however describe the benefits of a three-dimensional trench of the gate region leaving the source-to-gate and gate-to-drain distances left planar.

Periodical trenches along the source-to-drain distance with vertical and lateral AlGaN/GaN hetero-structure have been discussed in [9]. However, the direction of the current flow in the suggested structures is only two-dimensional.

It would be desirable to have GaN-based transistors with good current scaling. The scaling of the technology in current at the moment is limited to the lateral configuration. In fact, the present devices are limited to 100 A, with most of the devices being competitive under 20 A. The limitation in current is given by (i) limited surface conduction on account of the lateral flow of the current and (ii) wasted area due to the placement of all terminals and metal tracks at the surface.

It is an object of the present invention to address the poor current scaling and current collapse issues discussed above and concomitantly disclose a device with lower specific on state resistance, $R_{onsp}$ (the specific $R_{onsp}$=Ron×A where A is the surface active area).

SUMMARY

Aspects and preferred features are set out in the accompanying claims.

We disclose herein a lateral III-nitride semiconductor based heterojunction power device, comprising:
 a substrate;
 a III-nitride semiconductor region formed over the substrate;
 a source operatively connected to the III-nitride semiconductor region;
 a drain laterally spaced from the source and operatively connected to the III-nitride semiconductor region;
 a gate formed over the III-nitride semiconductor region, the gate being formed between the source and drain;
 wherein the III-nitride semiconductor region comprises:
  a first portion formed between the source and gate, wherein the source is in contact with the first portion, wherein the first portion comprises a heterojunction comprising a two dimensional carrier gas;
  a second portion formed between the gate and drain, wherein the drain is in contact with the second portion, wherein the second portion comprises a said heterojunction comprising a said two dimensional carrier gas;
 wherein at least one of the first and second portions of the III-nitride semiconductor region comprises:
  at least one trench formed within the III-nitride region having vertical sidewalls;
  mesa regions each extending away from each vertical sidewall of the at least one trench;
  wherein said two dimensional carrier gas is located within the heterojunction alongside the mesa regions and the at least one trench, and
 wherein at least one of the source and drain which is respectively in contact with the at least one of the first and second portions is in contact with said two dimensional carrier gas located alongside the at least one trench and alongside the mesa regions of the at least one of the first and second portions of the III-nitride semiconductor region.

In one embodiment, the two dimensional carrier gas alongside said at least one trench and mesa regions extends in a folded three dimensional area of the device.

In another embodiment, the heterojunction of the first portion and the second portion of the III-nitride semiconductor region comprises:
 a first III-nitride semiconductor layer having a first band gap formed over the substrate;
 a second III-nitride semiconductor layer having a second bandgap different from the first band gap disposed on the first III-nitride semiconductor layer; and
 a two dimensional carrier gas formed between the first and second III-nitride semiconductor layers to provide a channel.

In another embodiment, the first III-nitride semiconductor layer comprises said at least one trench and mesa regions, and wherein the second III-nitride semiconductor layer is disposed along the vertical sidewalls of the at least one trench and the mesa region.

In another embodiment, the first III-nitride semiconductor layer comprises said at least one trench and mesa regions, and wherein the second III-nitride semiconductor layer is disposed by filling the at least one trench and along the mesa region.

In another embodiment, the first III-nitride semiconductor layer of the first portion comprises said at least one trench and mesa regions, and wherein the first III-nitride semiconductor layer of the second portion does not comprise said at least one trench and mesa regions.

In another embodiment, the first III-nitride semiconductor layer of the second portion comprises said at least one trench and mesa regions, and wherein the first III-nitride semiconductor layer of the first portion does not comprise said at least one trench and mesa regions.

In another embodiment, the at least one trench comprises a bottom surface between the vertical sidewalls, and the second III-nitride semiconductor layer is disposed on the bottom surface of the at least one trench.

In another embodiment, the channel is formed along the vertical sidewalls and the bottom surface of the at least one trench and along the mesa regions.

In another embodiment, the channel comprises vertical portions along the vertical sidewalls and lateral portions along the bottom surface and along the mesa regions within the heterojunction.

In another embodiment, the vertical sidewalls of the at least one trench are closed to one another so that the channel formed along the vertical sidewalls are joined together.

In another embodiment, the joined channel comprises a vertical portion along the vertical sidewalls and lateral portions along the mesa regions.

In another embodiment, the source comprises a source terminal which is in direct contact with the channel in the first portion of the III-nitride semiconductor region.

In another embodiment, the source comprises a source terminal and a heavily doped contact region connected to the source terminal, wherein the contact region of the source is in direct contact with the channel in the first portion of the III-nitride semiconductor region.

In another embodiment, the drain comprises a drain terminal which is in direct contact with the channel in the second portion of the III-nitride semiconductor region.

In another embodiment, wherein the drain comprises a drain terminal and a heavily doped contact region connected to the drain terminal, wherein the contact region of the drain is in direct contact with the channel in the second portion of the III-nitride semiconductor region.

In another embodiment, wherein the III-nitride semiconductor region further comprises a third portion underneath the gate, the third portion being positioned between the first and second portions of the III-nitride semiconductor region.

In another embodiment, the third portion of the III-nitride semiconductor region comprises:
 the first III-nitride semiconductor layer over the substrate;
 the second III-nitride semiconductor layer disposed on the first III-nitride semiconductor layer; and
 the two dimensional carrier gas formed between the first and second III-nitride semiconductor layers to provide the channel within the heterojunction in the third portion of the III-nitride semiconductor region.

In another embodiment, the first III-nitride semiconductor layer comprises said at least one trench and mesa regions, and wherein said second III-nitride semiconductor layer is disposed along the vertical sidewalls and the bottom surface of the at least one trench and along the mesa region.

In another embodiment, the channel is formed at least along the vertical sidewalls and the bottom surface of the trench and along the mesa regions.

In another embodiment, the channel comprises vertical portions along the vertical sidewalls and lateral portions along the bottom surface and the mesa regions.

In another embodiment, the gate is formed directly on the second III-nitride semiconductor layer and along the vertical sidewalls and the bottom surface of the at least one trench and along the mesa regions.

In another embodiment, the third portion of the III-nitride semiconductor region comprises:
 the first III-nitride semiconductor layer over the semiconductor substrate, A further trench recessed to the first III-nitride semiconductor layer, wherein the further trench comprises vertical sidewalls and a bottom surface between the vertical sidewalls.

In another embodiment, a gate insulator is formed along the vertical sidewalls and on the bottom surface of the further trench, and the gate is formed by filling the further trench along the gate insulator.

In another embodiment, the source, drain and gate are configured such that, in an on-state operation, current flows through the channel between the drain and source at least along the sidewalls of the at least one trench and along the mesa regions.

In another embodiment, the first III-nitride semiconductor layer comprises a material comprising gallium nitride (GaN).

In another embodiment, the second III-nitride semiconductor layer comprises a material comprising aluminium gallium nitride (AlGaN) or aluminium nitride (AlN).

In another embodiment, the device further comprises aluminium nitride (AlN) between the GaN layer and the AlGaN layer.

In another embodiment, the first III-nitride semiconductor layer comprises p-doped gallium nitride wells underneath the mesa regions.

In another embodiment, the first III-nitride semiconductor layer comprises a p-doped gallium nitride well underneath the at least one trench.

In another embodiment, the first III-nitride semiconductor layer comprises p-doped gallium nitride wells underneath the mesa regions and a p-doped gallium nitride well underneath the at least one trench.

In another embodiment, the p-doped gallium nitride wells underneath the gate have a higher dose compared to those of the p-doped gallium nitride wells in the first and second portions of the III-nitride semiconductor region.

In another embodiment, the device further comprises a buffer layer between the III-nitride semiconductor region and the substrate, wherein the substrate is a silicon substrate.

In another embodiment, the buffer layer comprises a single layer of aluminium gallium nitride (AlGaN) or aluminium nitride (AlN).

In another embodiment, the buffer layer comprises a multilayer stack comprising a composition of aluminium gallium nitride (AlGaN) with varying aluminium concentration and gallium nitride (GaN).

In another embodiment, the device further comprises a passivation layer formed on the III-nitride semiconductor region along the at least one trench and on the mesa regions.

In another embodiment, the first bandgap of the first III-nitride semiconductor layer is lower compared to the second bandgap of the second III-nitride semiconductor layer, and wherein the two dimensional carrier gas formed between the first and second III-nitride semiconductor layer comprises a two dimensional electron gas.

In another embodiment, the first bandgap of the first III-nitride semiconductor layer is higher compared to the second bandgap of the second III-nitride semiconductor layer, and wherein the two dimensional carrier gas formed between the first and second III-nitride semiconductor layer comprises a two dimensional hole gas.

The at least one trench and mesa regions may be formed in a third dimension of the device. The trenches and mesa regions extend in respect of one another in a direction, which is different from a direction of current flow between the source and the drain. The skilled person will recognise that the claimed device is a lateral power device in which the current flows in a lateral direction between the source and drain. The skilled person would also recognise that the term "mesa region" refers to a region between two trenches.

Embodiments of the invention aim to solve the relatively poor current scaling issue in lateral devices and increase the effective area through which the current conduction from drain to source takes place. According to this invention, a three-dimensional (3D) geometry of the source-to-gate and gate-to-drain portions/distances is proposed. The 3D geometry allows a significant increase in current density by creating vertical and lateral channels made of the two dimensional electron gas in a third dimension of the device, which connect to the source and drain regions. The vertical channels can self-shield one another from the influence of traps occurring at the surface and/or in the bulk regions and/or between the trenches within the heterojunction.

In one of the embodiments, the close vicinity of the vertical and lateral channels will cause the vertical channels to join. The term "operatively connected" refers to a direct or indirect connection during operation of the device. The III-nitride semiconductor region can generally refer to a structure having two III-nitride layers formed on top of one another to provide a heterojunction structure. Generally, the top layer has a wider bandgap than the bottom layer. In such a case, a two dimensional electron gas (2DEG) is formed within the heterojunction structure. However, the invention also covers the case in which the top layer has a lower bandgap compared to the bottom layer. This arrangement results in forming a two-dimensional hole gas (2DHG) within the heterojunction structure. Embodiments also cover a structure in which the first, second and third portions have heterojunction layers.

The "first portion" refers to a III-nitride semiconductor region extending from the source to an edge of the gate which is in proximity of the source. However, the first portion may also cover the region underneath the gate (or up to an edge of the gate which is near to the drain contact). The "second portion" refers to a III-nitride semiconductor region extending from the drain to an edge of the gate which is in proximity of the drain. However, the second portion may also cover the region underneath the gate (or up to an edge of the gate which is near to the source contact). The term "direct contact" means a direct touch without any additional layer between the contact region (or terminals) and the III-nitride semiconductor region.

Contact regions can be placed at the drain and source sides which make an ohmic contact to the source and drain respectively. These contact regions could be etched regions filled partially or entirely with metals that form ohmic contacts with the 2DEG or 2DHG layers, or regions featuring very high n type doping, to form an ohmic contact with the source and metal terminals as well as to the 2DEG layer or 2DHG layer. The terminals, in the latter case, are favourably placed at the surface of the device. Contact regions may also mean a combination of etched regions with n-type implant onto which ohmic metals are formed to define the source and drain terminals. The first bandgap of the first III-nitride semiconductor layer may be lower compared to the second bandgap of the second III-nitride semiconductor layer, and wherein the two dimensional carrier gas formed between the first and second III-nitride semiconductor layer comprises a two dimensional electron gas.

The first bandgap of the first III-nitride semiconductor layer may be higher compared to the second bandgap of the second III-nitride semiconductor layer, and wherein the two dimensional carrier gas formed between the first and second III-nitride semiconductor layer comprises a two dimensional hole gas.

At least one or both of the source and drain are in direct contact with the two dimensional carrier (electron/hole) gas formed alongside the trenches within the heterojunction, the mesa regions and the contact regions of the respective first and second portions of the III-nitride semiconductor region. Embodiments of the invention cover the scenario where the source terminal is in direct contact with the two dimensional carrier (electron/hole) gas inside the trenches and contact regions of the first portion, and the drain terminal is in direct contact with the trenches and contact regions of the second portion. Embodiments of the invention also cover the scenario when only one of the source and drain terminals is in direct contact with the two dimensional carrier gas inside the trenches and the mesa regions of one of the first and second portions, but the other of the source and drain is not in contact with any trenches and the mesa regions of the other of first and second portions. This is because there may not be any trenches in the other portion.

It would be apparent to the skilled person that the term "at least one" means one or more. Therefore, embodiments of the invention cover one or more trenches and mesa regions in each portion of the III-nitride semiconductor region. The trenches and mesa regions are formed in a third dimension of the device. The dimension in which the trenches and the mesa regions are formed is to increase the current flow from the drain to source by providing a folded three dimensional area of the two dimensional carrier gas for conduction which will reduce significantly the on-state resistance (for a given active area at the surface of the device). It would be apparent to the skilled person that the source, gate and drain refer to a source contact (or terminal), a gate contact (or terminal) and a drain contact (or terminal) respectively. These can also refer to a source region, a gate region and a drain region respectively in which the source region comprises a source terminal and a highly doped contact region and the drain region comprises a drain terminal and a highly doped contact region The heterojunction of one or both of the first portion and the second portion of the III-nitride semiconductor region may comprise: a first III-nitride semiconductor layer having a first bandgap formed over the substrate; a second III-nitride semiconductor layer having a second bandgap different from the first bandgap disposed on the first III-nitride semiconductor layer; and a two dimensional carrier gas formed between the first and second III-nitride semiconductor layers to provide a channel in the first portion and/or the second portion of the III-nitride semiconductor region. The channel is provided by the two dimensional electron gas. This hetero-structure is present inside the walls of the trenches to increase the effective area of the channel (i.e. that is the area through which the current flow) between source and drain. It will be appreciated that the channel may be provided by a two dimensional hole gas when the second bandgap of the second III-nitride semiconductor layer is lower than the first bandgap of the first III-nitride semiconductor layer.

The heterojunction of one or both of the first portion and the second portion of the III-nitride semiconductor region may comprise an Aluminium Nitride (AlN) layer between the first and second III-nitride semiconductor layers.

The first III-nitride semiconductor layer may comprise the at least one trench and mesa regions, and the second III-nitride semiconductor layer may be disposed along the vertical sidewalls of the at least one trench and the mesa region. Here "along" refers that the second III-nitride layer extends in a same line as the first III-nitride layer.

The first III-nitride semiconductor layer may comprise the at least one trench and the mesa regions, and the second III-nitride semiconductor layer may be disposed by filling the at least one trench and along the mesa regions. This could be done by epitaxial growth or selective epitaxial growth for example. Filling the trenches with the epitaxial material could be beneficial as there may be no need for an additional passivation layer to be deposited in a conformal manner alongside the surface of the trench walls. This would ease the manufacturing process and help with the planarization process of the surface of the device.

The first III-nitride semiconductor layer of the first portion may comprise the at least one trench and mesa regions, and the first III-nitride semiconductor layer of the second portion may not comprise the at least one trench and mesa regions. In such a case, the second portion comprises a block of III-nitride semiconductor region comprising the first and second III-nitride layers. The drain is in direct contact with the block of III-nitride semiconductor region.

The first III-nitride semiconductor layer of the second portion may comprise the at least one trench and mesa regions, and the first III-nitride semiconductor layer of the first portion may not comprise the at least one trench and mesa regions. In such a case, the first portion comprises a block of III-nitride semiconductor region comprising the first and second III-nitride layers. The source is in direct contact with the block of III-nitride semiconductor region.

The at least one trench may comprise a bottom surface between the vertical sidewalls, and the second III-nitride semiconductor layer may be disposed on the bottom surface of the at least one trench.

The 2DEG or 2DHG channel may be formed at the interface of the heterojunction along the vertical sidewalls and the bottom surface of the at least one trench and along the mesa regions. The 2DEG or 2DHG channel may comprise vertical portions along the vertical sidewalls and lateral portions along the bottom surface and the mesa regions within the heterojunction.

The vertical sidewalls of the at least one trench may be closed to one another so that the channel portions formed along the vertical sidewalls are joined together to form a joined channel. The joined channel comprises vertical portions along the vertical sidewalls and lateral portions along the mesa regions. The close vicinity of the vertical and lateral portions of the channel cause the vertical channel portions to join and self-shield each-other from any trap phenomena occurring at the surface, and/or in the mesa region and/or in the bulk regions. This would help to increase the long term stability of the device while in operation.

The vertical portions and the lateral portions of the 2DEG or 2DHG channel may be formed in the first portion of the III-nitride semiconductor region. The source may be in direct contact with the lateral and vertical portions of the 2DEG or 2DHG channel. In other words, the entire source (terminal) touches both the lateral and vertical portions of the channel. This improves the current handling capability at the surface of the device.

The vertical portions and the lateral portions of the channel may be formed in the second portion of the III-nitride semiconductor region. The drain may be in direct contact with the lateral and vertical portions of the channel. In one embodiment, the entire drain (terminal) touches through a contact region both the lateral and vertical portions of the channel. This improves the current handling capability at the surface of the device. The folding channel comprised of vertical and lateral portions provides an increase in the effective area through which the current flows in the drift region to the drain terminal. The drift region, placed between the gate terminal and the drain terminal is the region that supports the voltage during the blocking mode of the device, when the device is off, and it therefore scales with the breakdown rating of the device. By using a folded channel with an increase effective area, the on-state resistance associated with the drift region can be minimised, and the current capability can be significantly increased.

The source may comprise a source terminal which is in direct contact with the channel in the first portion of the III-nitride semiconductor region. The source may comprise a source terminal and a heavily doped contact region connected to the source terminal. The contact region of the source may be in direct contact with the channel in the first portion of the III-nitride semiconductor region.

The drain may comprise a source terminal which is in direct contact with the channel in the second portion of the III-nitride semiconductor region. The drain may comprise a drain terminal and a heavily doped contact region connected to the drain terminal. The contact region of the drain may be in direct contact with the channel in the second portion of the III-nitride semiconductor region.

The III-nitride semiconductor region may further comprise a third portion underneath the gate, the third portion being positioned between the first and second portions of the III-nitride semiconductor region.

The third portion of the III-nitride semiconductor region may comprise:
  the first III-nitride semiconductor layer over the substrate;
  the second III-nitride semiconductor layer disposed on the first III-nitride semiconductor layer; and
  the two dimensional carrier gas formed between the first and second III-nitride semiconductor layers to provide the channel in the third portion of the III-nitride semiconductor region.

The first III-nitride semiconductor layer may comprises the at least one trench and mesa regions, and the second III-nitride semiconductor layer is disposed along the vertical sidewalls and the bottom surface of the at least one trench and along the mesa region.

The channel may be formed at least along the vertical sidewalls and the bottom surface of the trench and along the mesa regions.

The channel may comprise vertical portions along the vertical sidewalls and lateral portions along the bottom surface and the mesa regions.

The gate may be formed directly on the second III-nitride semiconductor layer along the vertical sidewalls and the bottom surface of the at least one trench and along the mesa regions. The gate thus provides a Schottky contact in the third portion of the device. This configuration generally provides a normally-on structure in which the 2DEG or 2DHG is formed underneath the gate when the gate-source voltage drop is zero. However a normally-off structure could also be implemented if, for example, under the Schottky gate there is a p-type doped layer.

The third portion of the III-nitride semiconductor region may comprise the first III-nitride semiconductor layer over the semiconductor substrate, and a further trench recessed to the first III-nitride semiconductor layer. The further trench may comprise vertical sidewalls and a bottom surface between the vertical sidewalls.

The heterojunction power device may further comprise a gate insulator formed along the vertical sidewalls and on the bottom surface of the further trench, and the gate may formed by filling the further trench along the gate insulator. The gate structure comprises an insulated gate as known in MOS (Metal-oxide-semiconductor) or MIS (Metal-insulator-semiconductor) gates and this configuration provides, potentially, a normally-off transistor. In the case of a normally-off device, no 2DEG or 2DHG layer is formed underneath the gate when the gate-source voltage drop is zero, and therefore no current can flow from source to drain. Current will only flow when the gate-source voltage bias is raised above the threshold voltage which will enable an inversion layer to be formed which connects to the 2DEG or 2DHG layers formed in the first and second regions.

The source, drain and gate may be configured such that, in an on-state operation, current flows through the channel (2DEG or 2DHG) between the drain and source at least along the sidewalls of the at least one trench and preferably also along the mesa regions in the within the hetero-structure formed in the mesa regions. In embodiments, the current also flows through the bottom surface between the vertical sidewalls. This arrangement provides improved current handling capability due to the increased surface area.

The first III-nitride semiconductor layer may comprise a material comprising gallium nitride (GaN). The second III-nitride semiconductor layer may comprise a material comprising aluminium gallium nitride (AlGaN) or aluminium nitride (AlN).

The first III-nitride semiconductor layer may comprise p-doped gallium nitride wells underneath the mesa regions. This could help with depleting the 2DEG or 2DHG channels and the mesa regions and establishing a depletion region in the drift region of the device, to block the voltage when the device is in the off-state. The level of p-type doping should be chosen to provide a desirable trade-off between the breakdown voltage and the charge strength of the channels (e.g., the electron concentration in the 2DEG channels)

The first III-nitride semiconductor layer may comprise a p-doped gallium nitride well underneath the at least one trench. This could help with depleting the channels and the mesa regions and establishing a vertical depletion region in the drift region of the device, underneath the at least one trench, to block the voltage when the device is in the blocking mode (i.e. off-state). The level of p-type doping should be chosen to provide an optimum trade-off between the breakdown voltage and the charge strength of the channels (e.g., the electron concentration in the channels).

The first III-nitride semiconductor layer may comprise p-doped gallium nitride wells underneath the mesa regions and a p-doped gallium nitride well underneath the at least one trench. This could help with depleting the channels and the mesa regions and establishing a vertical depletion region in the drift region of the device, underneath the at least one trench, to block the voltage when the device is in the blocking mode (i.e. off-state). The level of p-type doping should be chosen to provide an optimum trade-off between the breakdown voltage and the charge strength of the 2DEG channels (e.g., the electron concentration in the 2DEG channels).

The p-doped gallium nitride wells underneath the gate may have a higher dose compared to those of the p-doped gallium nitride wells in the first and second portions of the III-nitride semiconductor region. The exact level of p-type dose in each region is adjusted to provide a favourable trade-off between the 2DEG channel strength and the off-state blocking capability.

The heterojunction power device may further comprise a buffer layer (also known as transition layer) between the III-nitride semiconductor region and the substrate, wherein the substrate is a silicon substrate. This is to allow a mechanical stress relief between the III-nitride semiconductor and the substrate due to the lattice mismatch between the two materials. The substrate could be preferably made of silicon. At the same time, the buffer layer could provide the capability in off-state to block vertically the voltage between the drain terminal and substrate which preferably is connected to ground.

The buffer layer may comprise a single layer of aluminium gallium nitride (AlGaN) or aluminium nitride (AlN). The buffer layer may comprise a multilayer stack comprising a composition of aluminium gallium nitride (AlGaN) with varying aluminium concentration and gallium nitride (GaN).

The heterojunction power device may further comprise a passivation layer formed on the III-nitride semiconductor region along the at least one trench and on the mesa regions.

We also disclose herein a method of manufacturing a III-nitride semiconductor based heterojunction power device, the method comprising:
  forming a substrate;
  forming a III-nitride semiconductor region formed over the substrate;
  forming a source operatively connected to the III-nitride semiconductor region;
  forming a drain laterally spaced from the source and operatively connected to the III-nitride semiconductor region; and
  forming a gate formed over the III-nitride semiconductor region, the gate being formed between the source and drain;
  wherein the III-nitride semiconductor region comprises:
  a first portion formed between the source and gate, wherein the source is in contact with the first portion, wherein the first portion comprises a heterojunction comprising a two dimensional carrier gas;
  a second portion formed between the gate and drain, wherein the drain is in contact with the second portion, wherein the second portion comprises a said heterojunction comprising a said two dimensional carrier gas;
  wherein at least one of the first and second portions of the III-nitride semiconductor region comprises:
  at least one trench having vertical sidewalls and being formed within the III-nitride semiconductor region;
    mesa regions each extending away from each vertical sidewall of the at least one trench;
    wherein the two dimensional carrier gas is alongside the mesa regions and the at least one trench and
  wherein at least one of the source and drain which is respectively in contact with the at least one of the first and second portions is in contact with the two dimensional carrier gas alongside of both the at least one trench and alongside the mesa regions of the at least one of the first and second portions of the III-nitride semiconductor region.

The step of forming the III-nitride semiconductor region may comprise:
  forming a first III-nitride semiconductor layer having a first band gap over the substrate; and
  forming the at least one trench and the mesa regions in the first III-nitride semiconductor layer.

The first III-nitride semiconductor layer may be formed using any one of Metal-Organic Chemical Vapour Deposition (MOCVD) and Molecular Beam Epitaxy (MBE).

The at least one trench may be formed using any one of reactive ion etching and deep reactive ion etching or wet etching.

The method may further comprise forming a second III-nitride semiconductor layer having a second band gap different from the first band gap along the at least one trench and on the mesa regions.

The method may further comprise forming a second III-nitride semiconductor layer having a second band gap different from the first band gap by completely filling the at least one trench and on the mesa regions.

The method may further comprise forming a passivation layer on the second III-nitride semiconductor layer.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
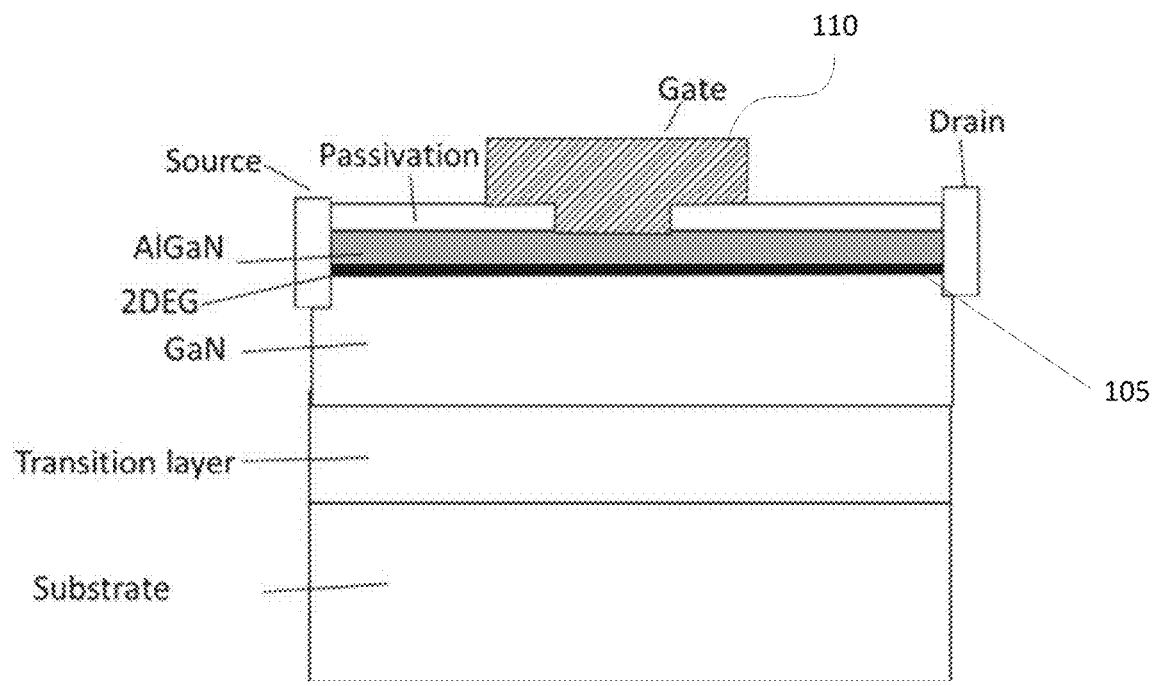
FIG. 1 is a schematic representation of a known HEMT.
Figure 2:
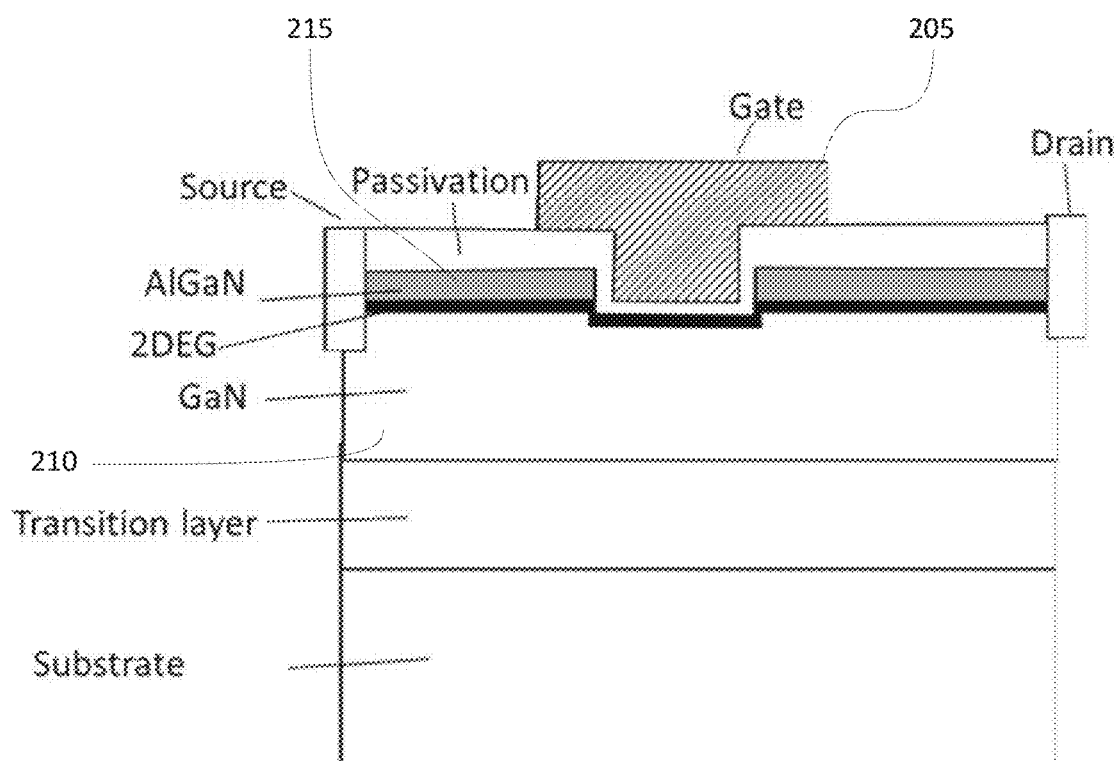
FIG. 2 shows a schematic representation of a known HEMT in which an insulated gate technology is used.
Figure 3:
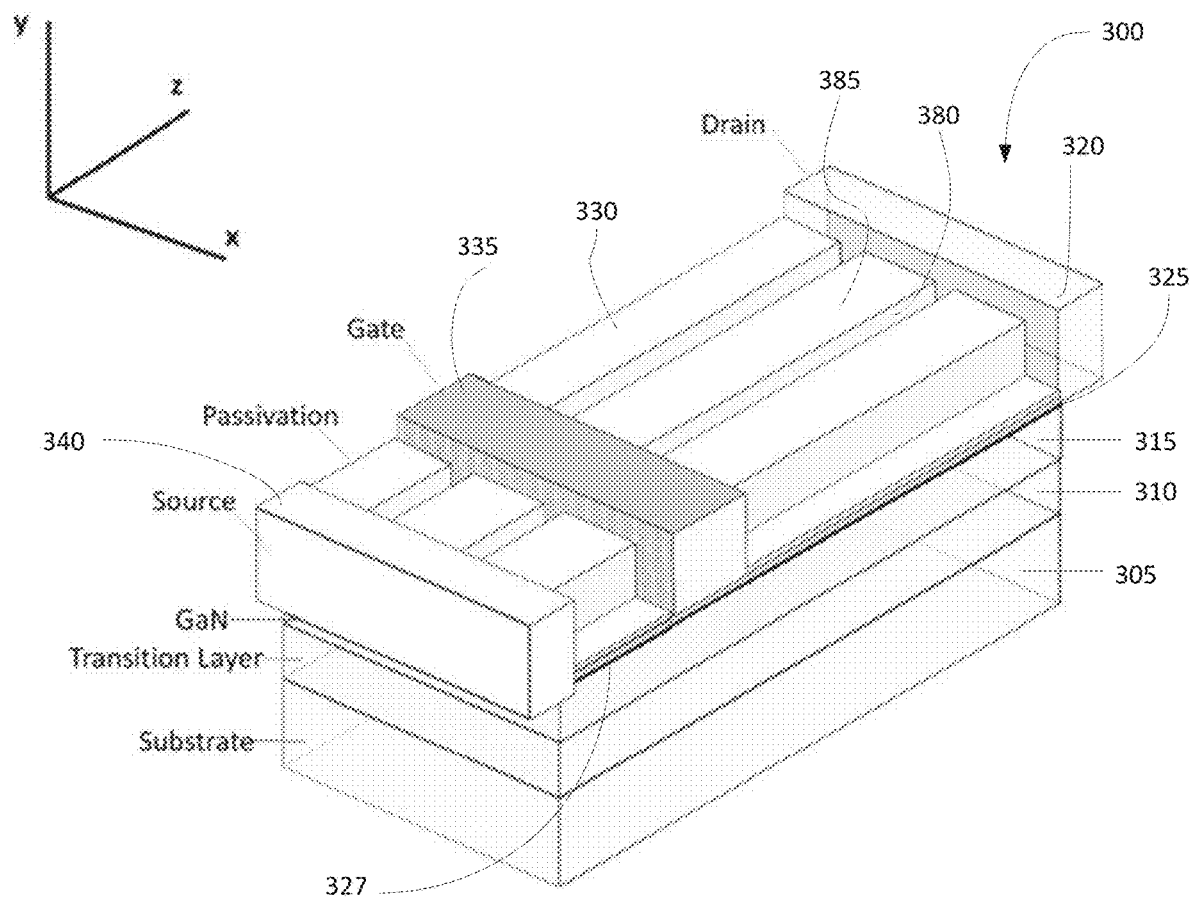
FIG. 3 is a schematic three-dimensional (3D) view of a GaN based semiconductor device 300 according to one embodiment of the present invention.

FIG. 3 is a schematic three-dimensional (3D) view of a GaN based semiconductor device 300 according to one embodiment. The device 300 is presented in three dimensions: a first dimension (z-direction), a second dimension (y-direction) and a third dimension (x-direction). The device 300 could be a normally-on or normally off device on a Silicon (Si) substrate 305. It will be appreciated that any other substrates for GaN devices can be used. Examples of alternative substrate material are Sapphire, Silicon Carbide, and GaN.

In the embodiment of FIG. 3 (where a Si substrate is used), the device 300 comprises a buffer layer 310 on top of the substrate 305 to alleviate the lattice mismatch between the Si substrate 305 and the III-nitride materials such as GaN. The buffer layer, also known as transition layer, 310 may comprise a single layer of $Al_xGaN_{1-x}N$ (with x varying between 0 and 1) or any composition of $Al_xGaN_{1-x}N/GaN$ creating a multilayer stack. It will be appreciated that the buffer layer 310 may not be used in the device, particularly when the substrate 305 is not Si.

A GaN active layer 315 is grown on top of the buffer 310/substrate 305 stack using a suitable growth technique. Examples of these are Metal-Organic Chemical Vapour Deposition (MOCVD) and Molecular Beam Epitaxy (MBE).

The GaN active layer 315 is corrugated (or shaped) with a plurality of trenches 380 along the x direction (in the third dimension). Each trench 380 defines a plurality of mesa regions 385. Each trench 380 includes vertical sidewalls and a bottom surface between the vertical sidewalls. The mesa region 385 is formed between two trenches 380 or on both sides of one trench 380. The mesa region 385 is adjoined to a top edge of the vertical sidewall of the trench 380. The mesa region 385 is generally a projected or protruded flat region between two recessed trenches 380. Although FIG. 3 shows multiple trenches 380 and mesa regions 385, the device 300 may have one trench and two mesa regions on both sides of the trench formed along the x-direction.

In the example of FIG. 3, a further (second) III-nitride material 325 with a wider bandgap than the one of the active layer 315 is grown on the GaN trenches 380 at the bottom surface and on the sidewalls to form a barrier layer. The further III-nitride material 325 can be for example $Al_xGaN_{1-x}N$ (with any x>0). In the example of FIG. 3, the further III-nitride material 325 (e.g. AlGaN) is grown along the trenches 380 and mesa regions 385 of the GaN layer 315. The further III-nitride material 325 together with the active layer 315 forms a heterojunction. In one embodiment, the further III-nitride material 325 (e.g. AlGaN) can be filled within the trenches 380 and is formed along the mesa region 385.

A passivation layer 330 is deposited in a conformal way within the trenches on top of the barrier layer. Examples of possible passivation layers are Silicon Nitride (SiN) and Silicon Dioxide ($SiO_2$).

A 2DEG conductive channel 327 is formed along the x-direction (or a horizontal direction) and the y-direction (or a vertical direction) at the barrier layer 325/active layer interface 315 (AlGaN/GaN for example) within the heterojunction. The 2DEG conductive channel 327 also extends along the z-direction between the source 340 and drain 320. The 2DEG conductive channel 327 has therefore a three-dimensional geometry. In other words, the channel 327 has a lateral portion in the x-direction and a vertical portion in the y-direction (but the vertical portion is still arranged in the x-direction with respect to the lateral portion). The lateral portion and the vertical portion both extend towards the z-direction to form the three-dimensional geometry. The channel 327 has a corrugated (folded) design with extremely high surface effective area (for example, an increase from 2 to 5× with respect to a 2 dimensional channel as described in prior art), leading to a higher conduction area through which the current flows in the on-state and therefore provides a significantly higher current rating capability. The increased channel density (due to the larger area for conduction) also results in a lower on-state resistance and therefore lower on-state losses compared to a state-of-the-art HEMT designed for the same voltage and current ratings.

Ohmic source contact 340 and ohmic drain contact 320 are fabricated by means of any known fabrication process. The source contact 340 and drain contact 320 extends towards the x-direction and connect the multiple lateral portions and vertical portions of the channel 327 along the x-direction. Since the source contact 340 and the drain contact 320 are configured to touch or contact all the trenches 380 and mesa regions 385, the current flows through the channel 327 formed in the vertical side walls and the bottom surface of the trenches 380 and through the mesa regions 385. The source contact 340 and the drain contact 320 touch or are in contact the vertical side walls and the bottom surface of each trench 380 and the mesa regions 385 of the device 300. In other words, the source 340 and the drain contact 320 fully (or completely) touch the entire trenches 380 and mesa regions 385 in the third dimension (or x-direction) of the device 300.

Alternatively the source contacts (terminals) and drain contacts (terminals) are in contact with the vertical side walls and the bottom surface of each trench 380 and the mesa regions 385 of the device 300 via further contact regions (not shown in FIG. 3), which could be made for example of highly doped n-type III-nitride materials. The contact regions may facilitate an ohmic contact between the channel 327 and the source and drain terminals.

A gate contact 335 is fabricated by filling in the trenches within a narrow gate region formed in the proximity of the source contact 340, to deplete the lateral portions and vertical portions of the channel 327 when a more negative potential is applied (that is a potential that is lower than the threshold voltage). Generally, the gate contact 335 is disposed closer to the source contact 340 than to the drain contact 320. For example, the distance between the source contact 340 and gate contact 335 could be about 3 µm, and the distance between the drain contact 320 and gate contact 335 could be about 20 µm. In this example, the gate contact 335 forms a Schottky contact on the AlGaN (barrier layer) 325 without having a passivation layer between the gate contact 335 and the AlGaN layer 325.

In the example of FIG. 3, the active region can be divided into three portions: (1) a source-gate portion (the first portion), (2) a drain-gate portion (the second portion), and (2) a gate portion underneath the gate (the third portion). The active region is defined by the channel region 327 formed at the interface between the GaN layer 315 and AlGaN layer 325. The source-gate portion (or the first portion) is defined by the active region extending from the source contact 340 to a first edge (close to the source contact) of the gate contact 335. The gate portion (or the third portion) is defined by the active region directly underneath the gate contact 335. The drain-gate portion (or the second portion) is defined by the active region from a second edge (close to the drain contact) of the gate contact to the drain contact. In this example, all the three portions are corrugated. However, it is possible that the source-gate portion may not be corrugated, whilst the gate portion and the drain-gate portions are corrugated. It is also possible that drain-gate portion is finely corrugated so that the vertical sidewalls of the trenches are close to one another. This arrangement results in a 'mostly' vertical configuration of the channels. The narrow pitch between subsequent planes of 2DEG channels means that the channels shield one another from any surface, bulk or mesa charge or taps avoiding or reducing the effect of instabilities in long term operation such as increased in the on-state resistance or current reduction or current collapse.

The skilled person would understand from the example of FIG. 3 that the GaN layer 315 and the AlGaN layer 325 collectively form a III-nitride semiconductor region.

Figure 4:
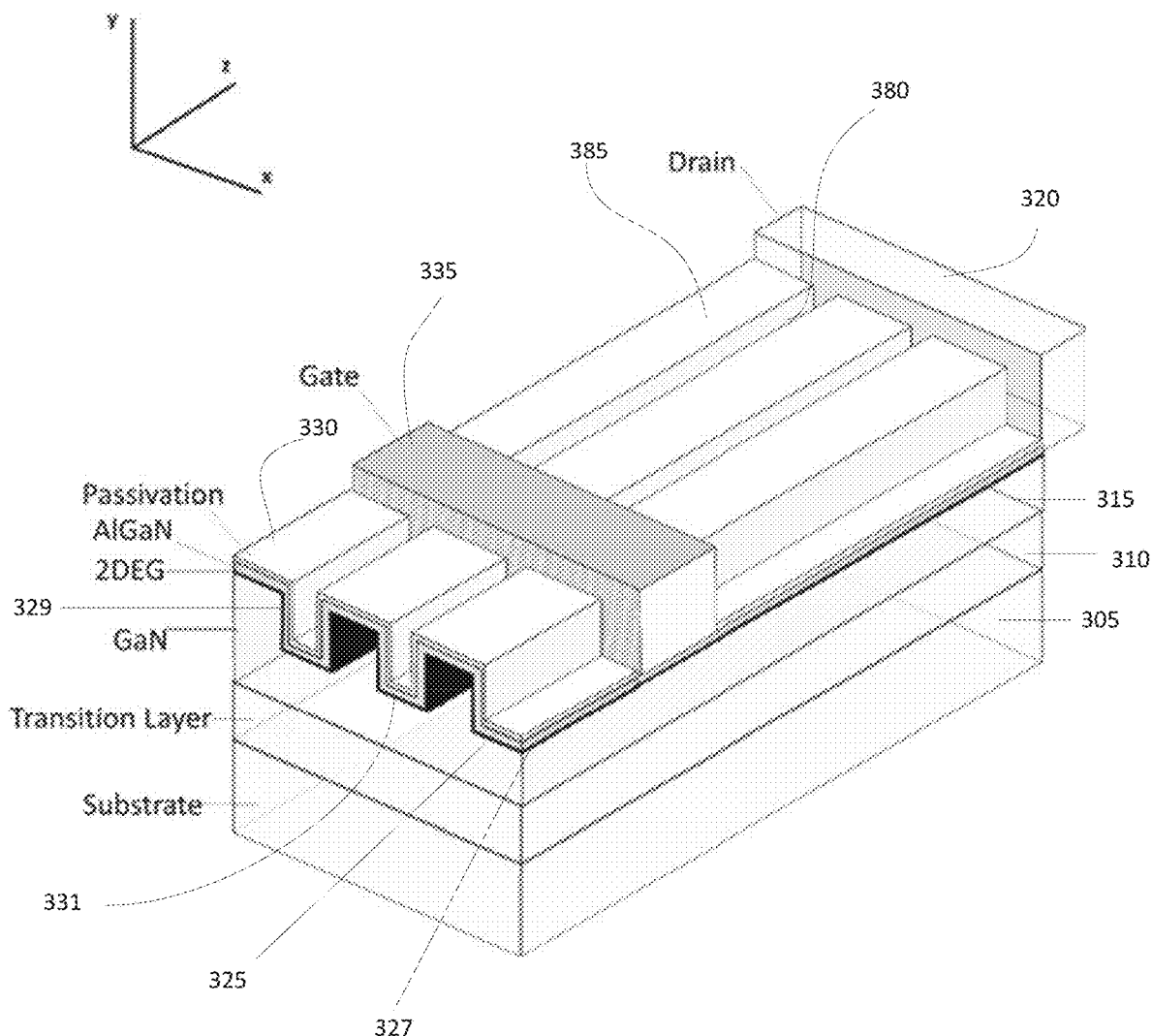
FIG. 4 illustrates a three-dimensional (3D) view of the semiconductor device of FIG. 3 without the source contact.

FIG. 4 illustrates a three-dimensional (3D) view of the semiconductor device of FIG. 3 without the source contact. Many features of the structure of FIG. 3 are the same as those in FIG. 4 and therefore carry the same reference numbers. FIG. 4 illustrates the corrugated geometry in the layers from the source to drain. The formation of 2DEG channel 327 along the x-direction using lateral portions 331 and vertical portions 329 are shown in FIG. 4.

Figure 5:
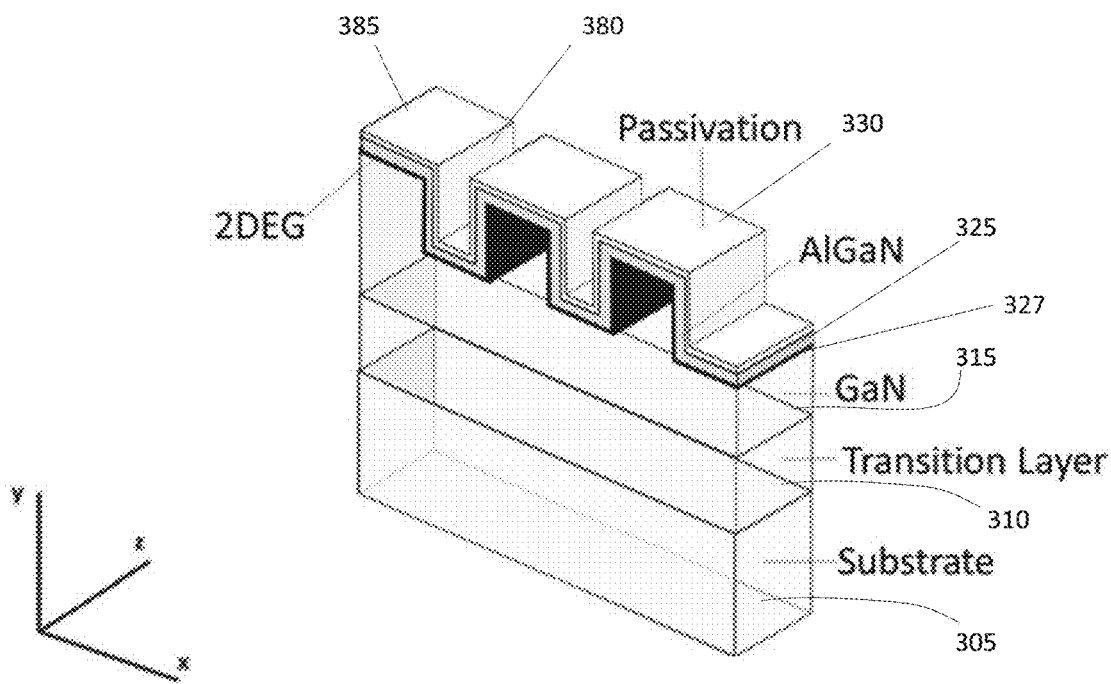
FIG. 5 illustrates a three-dimensional (3D) view of a portion of the corrugated region of the semiconductor device of FIG. 3.

FIG. 5 illustrates a three-dimensional (3D) view of a portion of the corrugated (or trenched) region of the semiconductor device of FIG. 3. Many features of the portion of FIG. 5 are the same as those in FIG. 3 and therefore carry the same reference numbers.

The portion of FIG. 5 can be part of the source-gate portion (or the first portion) and/or the drain-gate portion (or the second portion).

Figure 6:
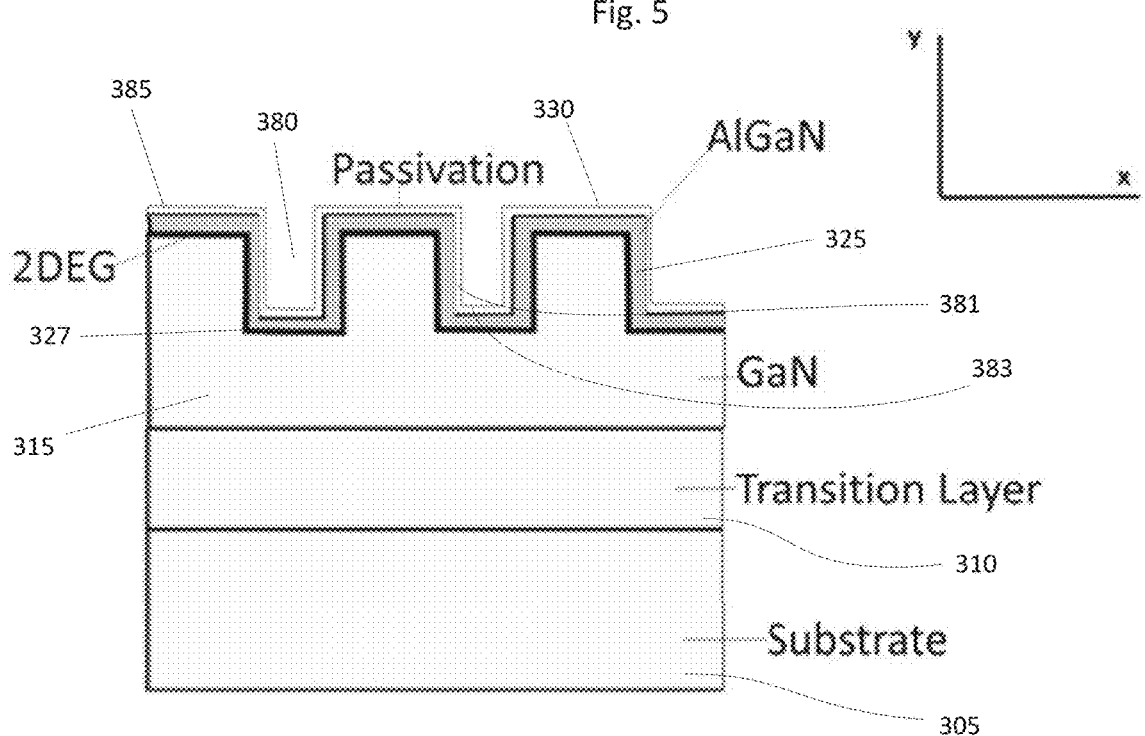
FIG. 6 illustrates a planar (or an orthographic projection) of corrugated portion of FIG. 5.

FIG. 6 illustrates a planar view (or an orthographic projection) of the corrugated portion of FIG. 5. The reference numerals for FIG. 6 are the same as those in FIG. 5. However, the vertical sidewalls 381 and the bottom surface 383 between the vertical sidewalls 381 are shown in FIG. 6.

Figure 7:
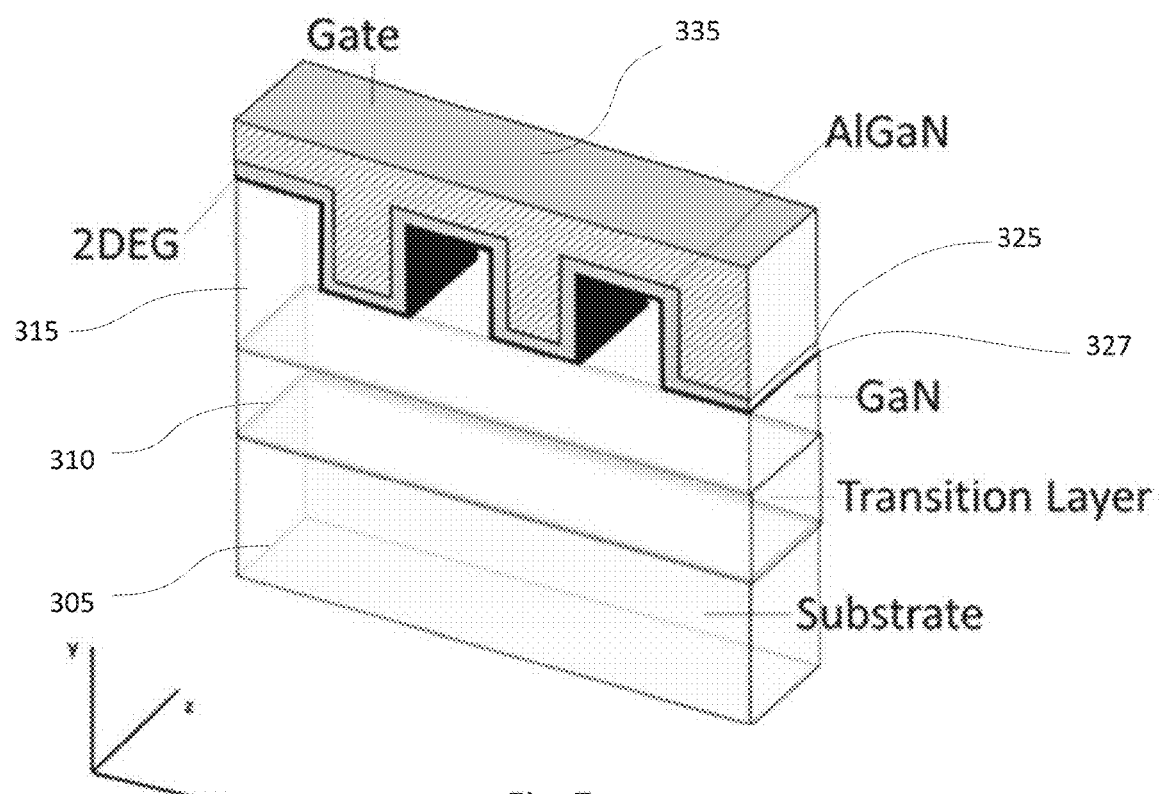
FIG. 7 illustrates a 3D view of a portion of the corrugated region underneath the gate of the semiconductor device of FIG. 3.

FIG. 7 illustrates a 3D view of a portion of the corrugated region underneath the gate 335 of the semiconductor device of FIG. 3. The reference numerals are the same as those used in FIG. 3. In the normally-on structure of FIG. 3, there is no passivation layer underneath the gate contact 335. The gate 335 is therefore a Schottky metal. By applying a more negative potential to the gate with respect to the source (below the threshold voltage) the 2DEG channel 327 beneath gate 335 can be depleted.

Figure 8:
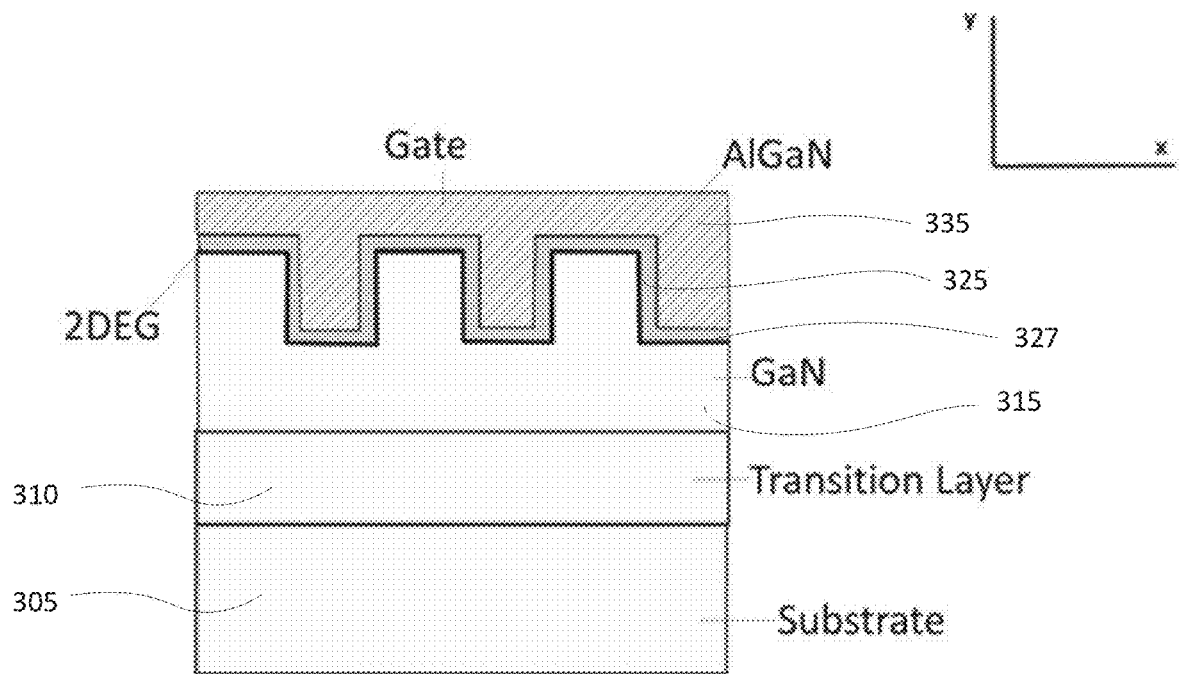
FIG. 8 illustrates a planar view (or an orthographic projection) of the gate portion of FIG. 7.

FIG. 8 illustrates a planar view (or an orthographic projection) of the gate portion of FIG. 7. The features of FIG. 8 are therefore the same as those in FIG. 7 and carry the same reference numbers. No passivation layer is included between the gate contact 335 and the AlGaN layer 325.

It will be appreciated that the structures of FIG. 3 to FIG. 8 form part of a same embodiment and are configured to operate in an on-state operation of the device. The current normally flows through the channel 327 which forms part of at least the mesa regions 385 and vertical sidewalls of trenches 380. The source, drain and gate contacts are configured/shaped to contact both the mesa region and trenches (at least the vertical sidewalls and also the bottom surface between the sidewalls). The three dimensional corrugation of the channel provides a high surface area leading to a higher conduction area and therefore provides a significantly higher current rating capability.

Figure 9:
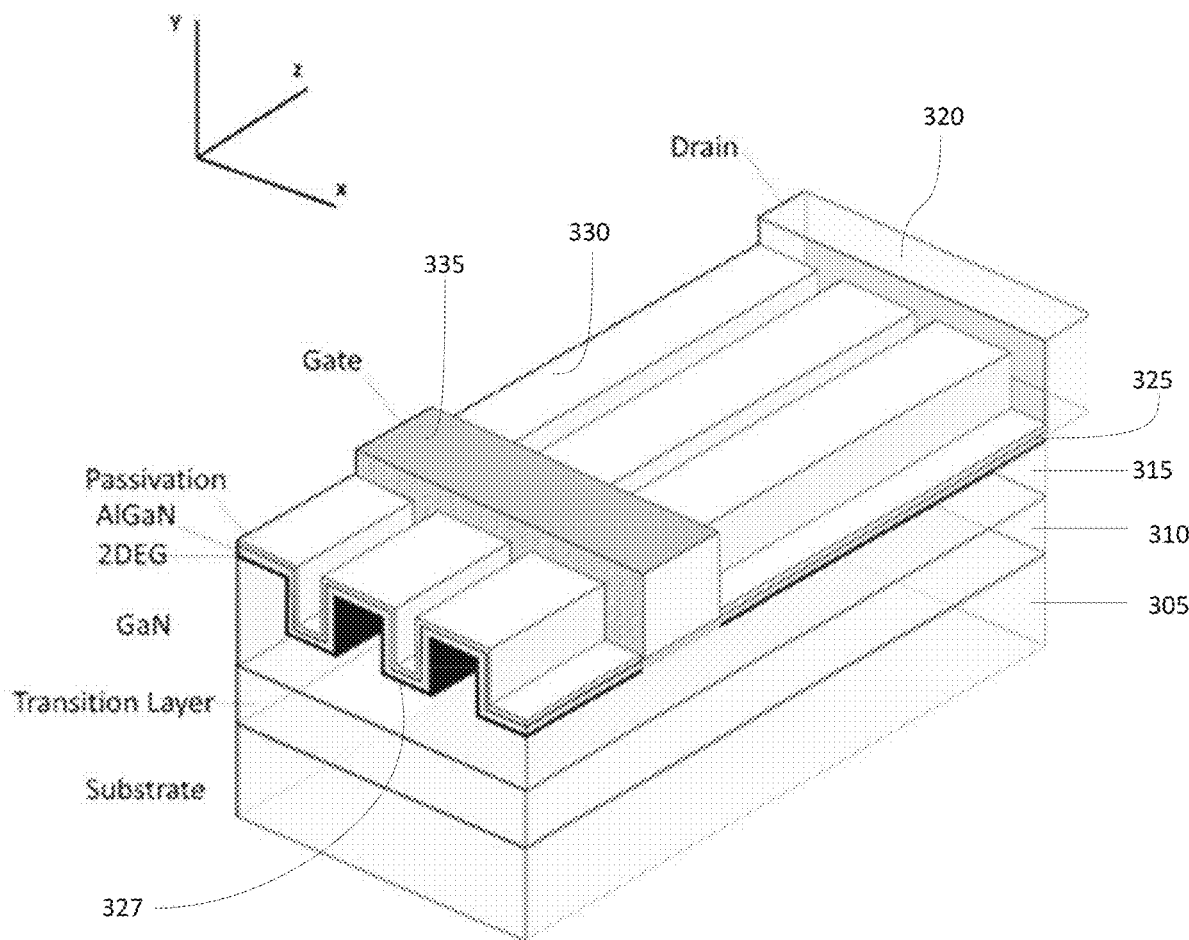
FIG. 9 illustrates the semiconductor structure of FIG. 4 in an off-state operation.

FIG. 9 illustrates the semiconductor structure of FIG. 4 in an off-state operation. Many features of the structure of FIG. 9 are the same as those in FIG. 4 and therefore carry the same reference numbers. However, in the structure of FIG. 9, a negative potential is applied to the gate contact 335, which depletes the 2DEG channel 327 underneath the gate contact 335. Therefore, almost no current conducts between the source contact 340 and the drain contact 320 when the drain is biased positively.

Figure 10:
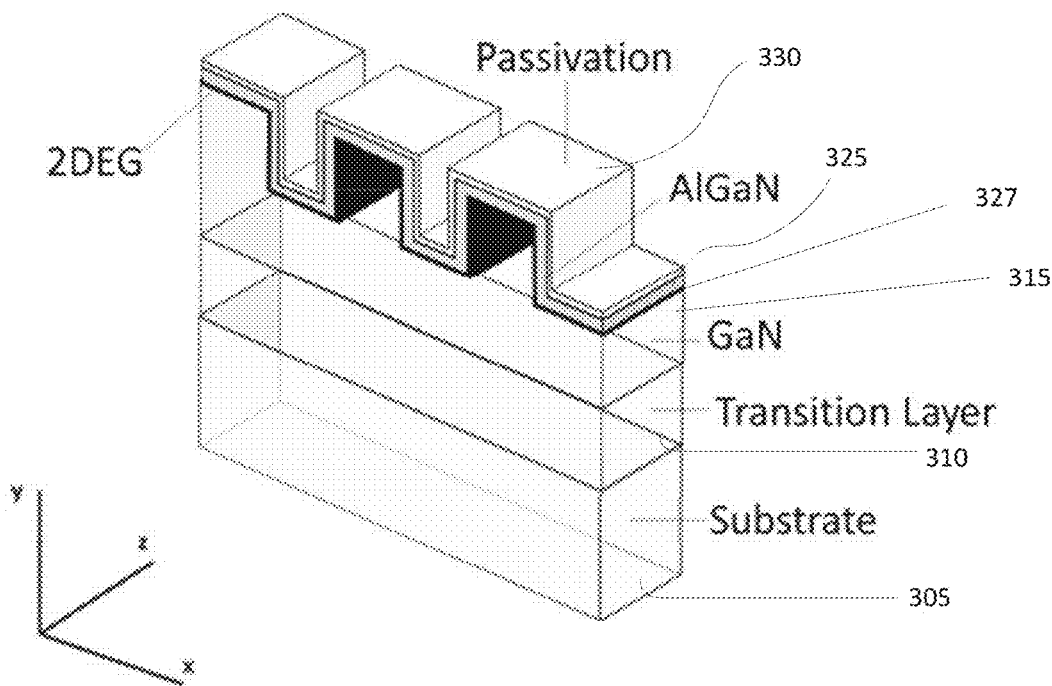
FIG. 10 illustrates a portion of the corrugated region of FIG. 9 in the off-state operation.

FIG. 10 illustrates a portion of the corrugated region of FIG. 9 in the off-state operation. The reference numerals are the same as those in FIG. 9. The portion of FIG. 10 can be the source-gate portion and/or the drain-gate portion. It will be noted that during the off-state operation, the 2DEG channel 327 is still present in the source-gate portion and the drain-gate portion.

Figure 11:
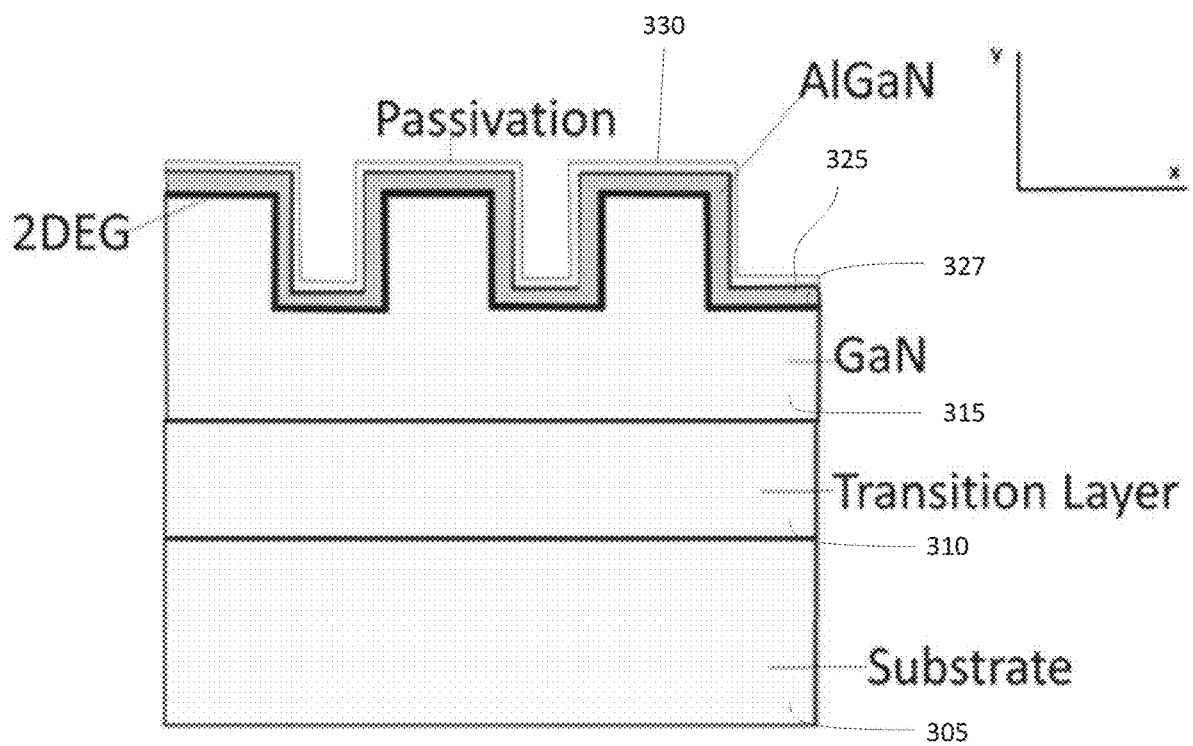
FIG. 11 illustrates a planar view (or an orthographic projection) of the portion of FIG. 10 in the off-state operation.

FIG. 11 illustrates a planar view (or an orthographic projection) of the portion of FIG. 10 in the off-state operation. The reference numbers are therefore same as those in FIG. 10. It is noted that 2DEG channel 327 is present when the drain potential is the same as the source potential. However as the drain voltage is increased while the device is still in the off-state, the 2DEG channel 327 in the portion between the gate and the drain starts to deplete from the gate side towards the drain. At high drain voltages, the 2DEG channel in the portion between gate and the drain may be fully depleted.

Figure 12:
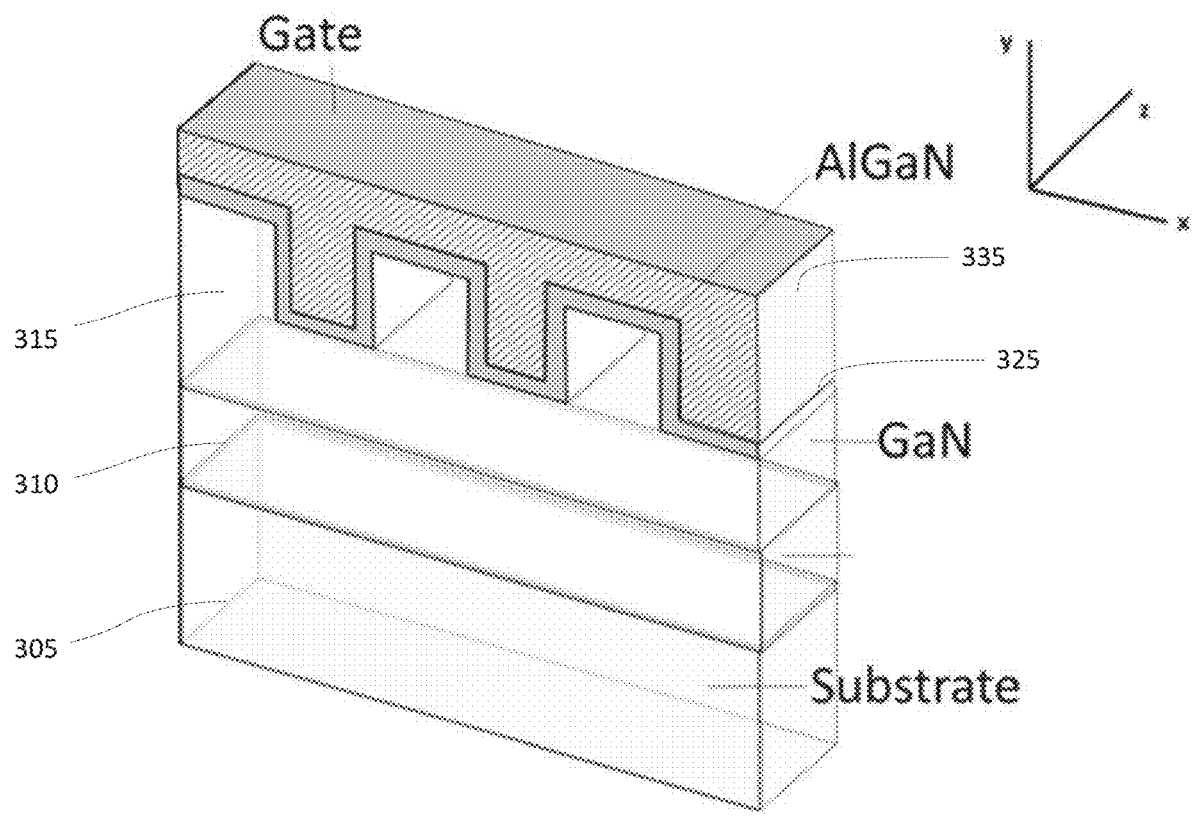
FIG. 12 illustrates a 3D view of a gate portion of the structure of FIG. 9 in the off-state operation.

FIG. 12 illustrates a 3D view of a gate portion of the structure of FIG. 9 in the off-state operation, where the gate-source voltage is more negative than in the on-state and below the threshold voltage. In this case no 2DEG channel is present underneath the gate 335 as the more negative potential applied to the gate depletes the 2DEG underneath the gate 335. In this mode, there is no conduction (other than leakage) between the source and drain terminals.

Figure 13:
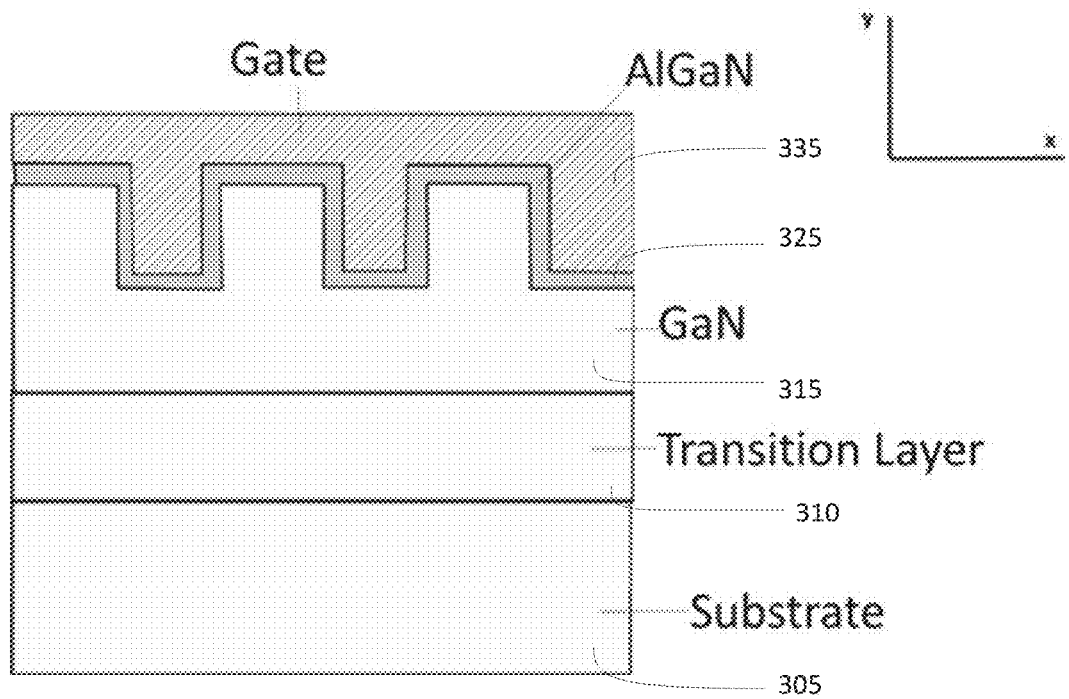
FIG. 13 illustrates a planar view (or an orthographic projection) of the gate portion of the structure of FIG. 12.

FIG. 13 illustrates a planar view (or an orthographic projection) of the gate portion of the structure of FIG. 12. The structural features of FIG. 13 are the same as those of FIG. 12 and therefore have the same reference numbers. FIG. 13 also shows that no 2DEG channel is present underneath the gate region due to the negative potential applied to the gate contact 335.

It will be appreciated that the structural features of FIG. 9 to FIG. 13 form part of the same embodiment of the structural features of FIG. 3 to FIG. 8. The difference between them is that FIG. 3 to FIG. 8 represent the structural features during the on-state operation of the device, whereas FIG. 9 to FIG. 13 represent the structural features during the off-state operation of the device.

Figure 14:
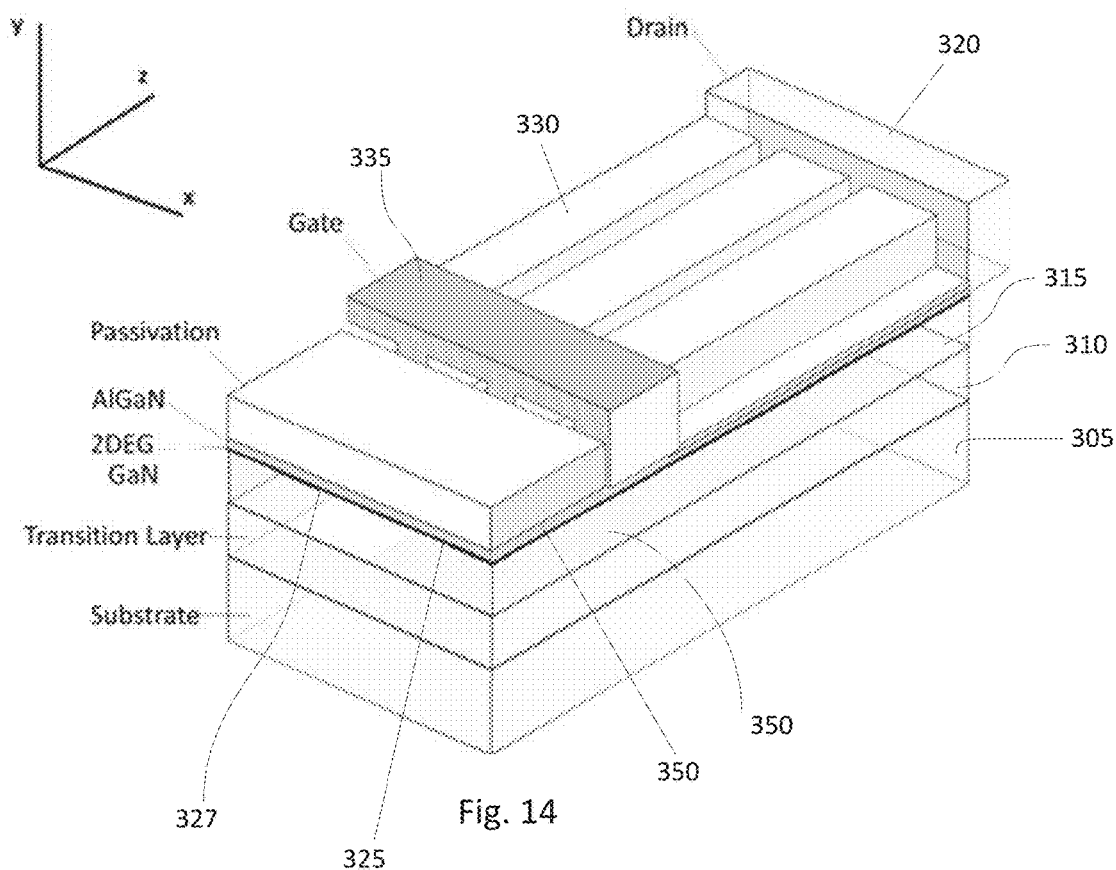
FIG. 14 illustrates a 3D view of an alternative semiconductor transistor in the on-state and without the source contact according to one embodiment.

FIG. 14 illustrates a 3D view of an alternative semiconductor transistor according to one embodiment. Many features of the transistor of FIG. 14 are the same as those in FIG. 4, except that the source-gate portion 350 of the transistor is not corrugated. The source contact is not shown in this figure (see FIG. 15 below). The gate portion underneath the gate 335 is corrugated and the drain-gate portion is also corrugated.

Figure 15:
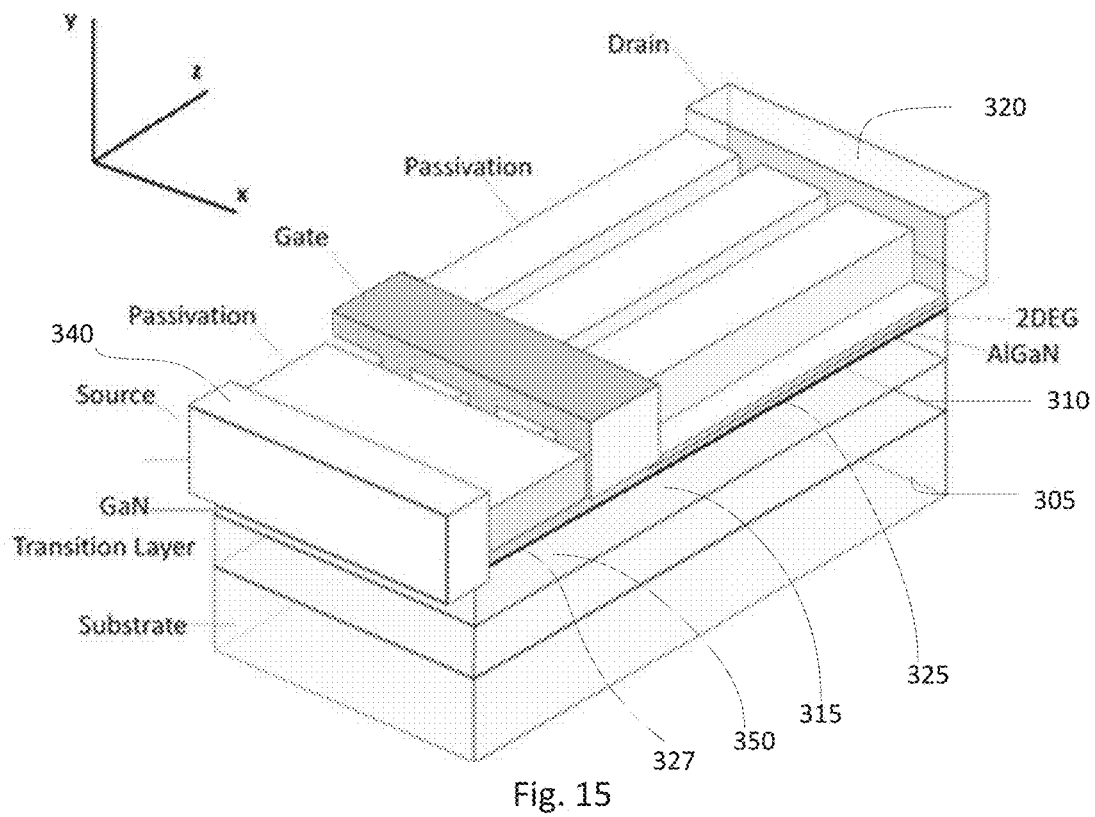
FIG. 15 illustrates a 3D view of the transistor of FIG. 14 in which the source contact is explicitly shown.

FIG. 15 illustrates a 3D view of the transistor of FIG. 14 in which the source contact 340 is explicitly shown. The features of the transistor of FIG. 14 are the same as those of FIG. 13 and therefore carry the same reference numbers.

Figure 16:
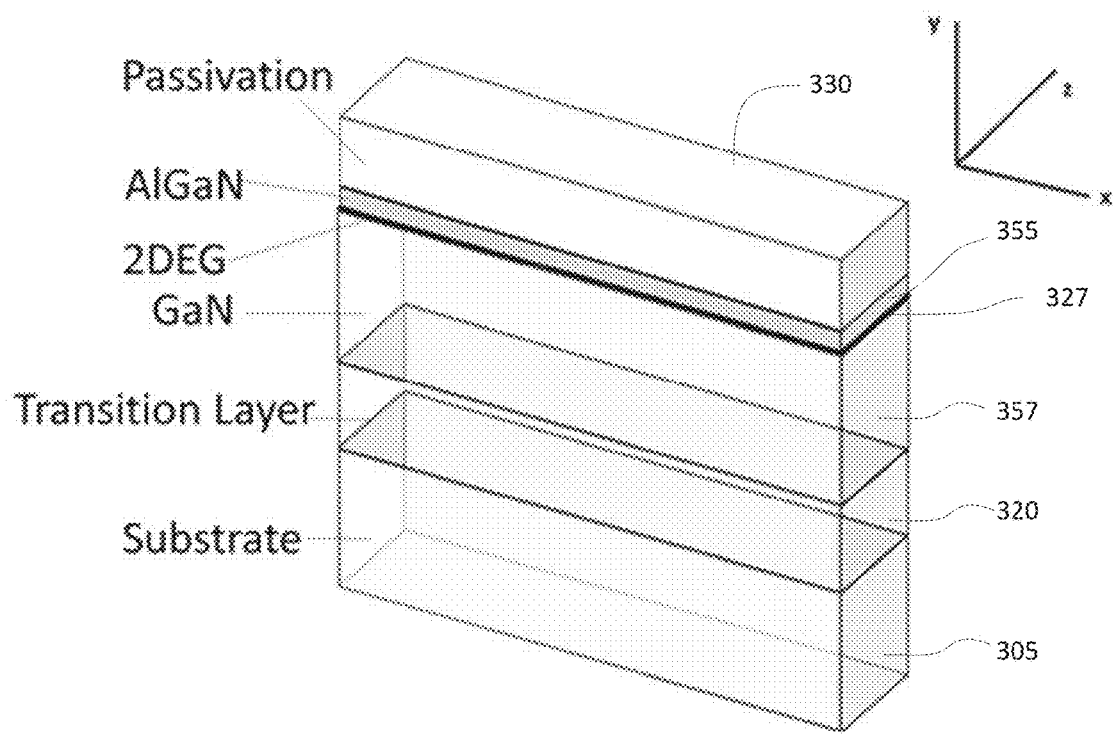
FIG. 16 illustrates a 3D view of the source-gate portion of the transistor of FIG. 15.

FIG. 16 illustrates a 3D view of the source-gate portion of the transistor of FIG. 15. It is clear from this figure that the GaN layer 355 and the AlGaN layer 357 are not corrugated and therefore the 2DEG channel 327 is also not corrugated in the source-gate portion (or the first portion) of the transistor.

Figure 17:
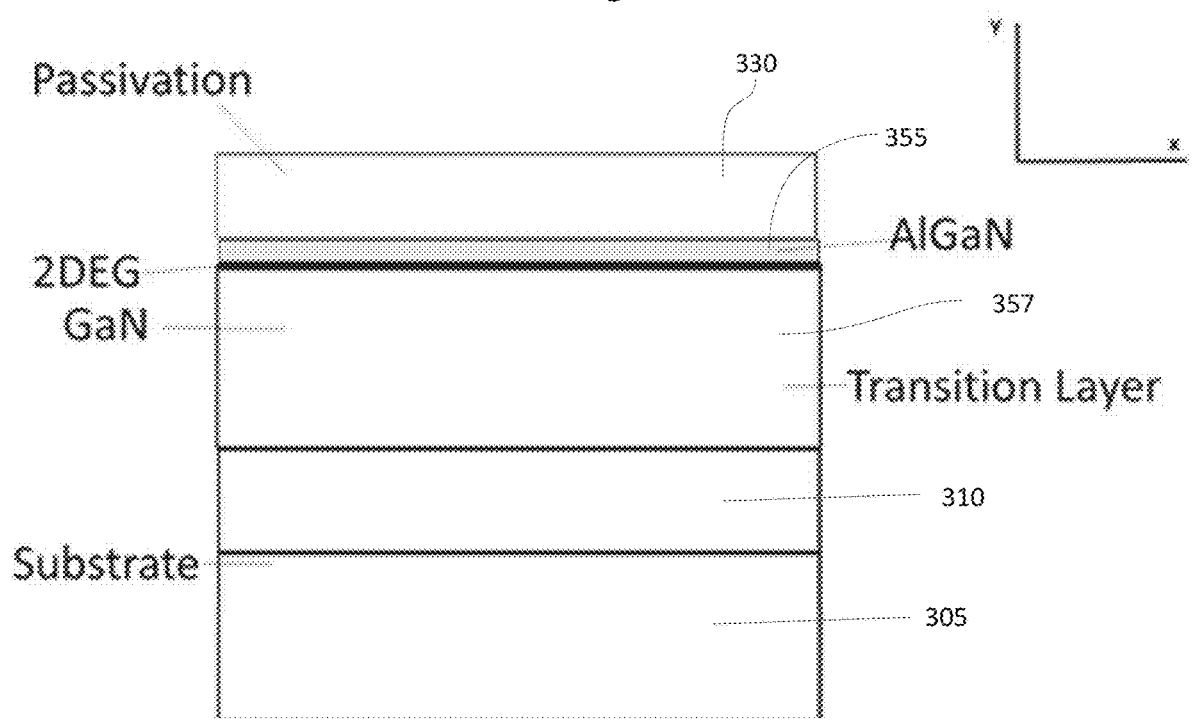
FIG. 17 illustrates a planar view (or an orthographic projection) of the 3D view of the source-gate portion of FIG. 16.

FIG. 17 illustrates a planar view (or an orthographic projection) of the 3D view of the source-gate portion of FIG. 16. It is apparent from this figures that no corrugated structure is present in the source-gate portion of the transistor.

It will be appreciated that the present invention also covers the scenarios where the source-gate portion and gate portion are corrugated, but the drain-gate portion is not corrugated. It also covers an embodiment in which the source-gate portion and the gate portion (or the third portion) are not corrugated (or trenched), but only the drain-gate portion (or the second portion) is corrugated. The skilled person would be able to contemplate such variations from the teaching of the present invention.

Figure 18:
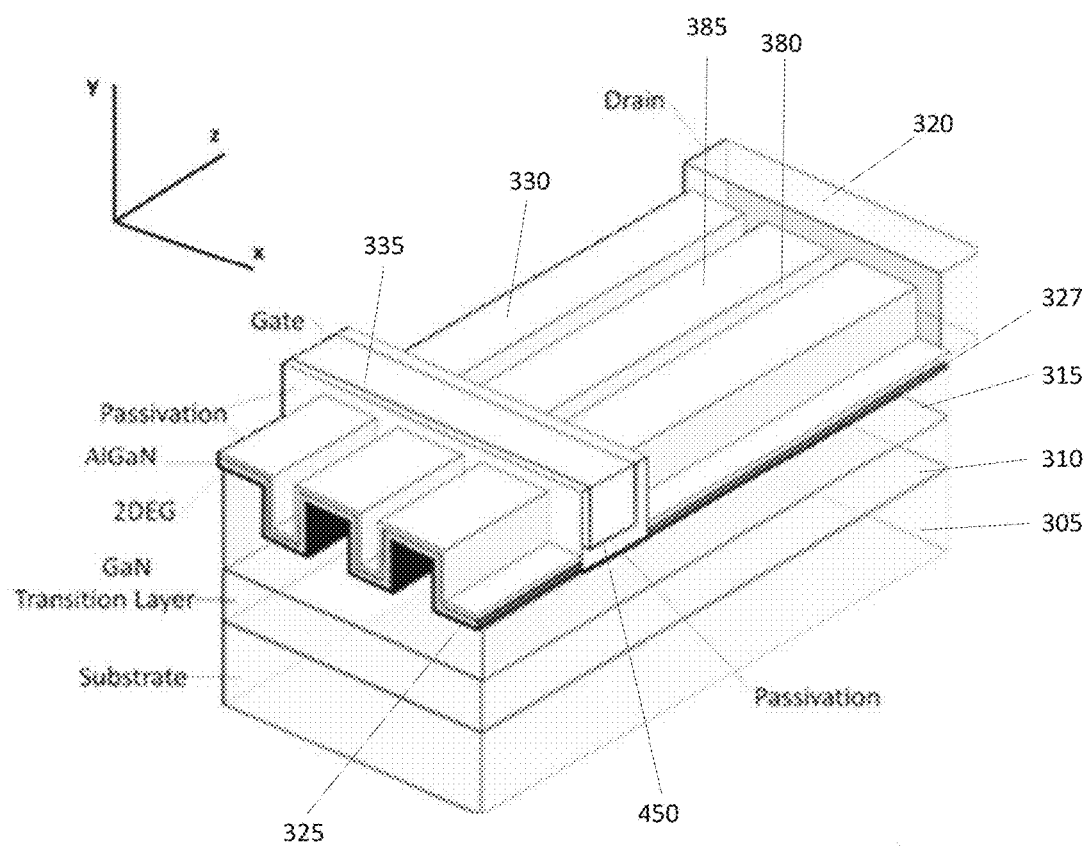
FIG. 18 illustrates a 3D view of an alternative semiconductor transistor according to one embodiment.

FIG. 18 illustrates a 3D view of an alternative semiconductor transistor according to one embodiment. The transistor is a normally-off transistor. Many features of the transistor of FIG. 18 are the same as those in FIG. 3, except that there is no barrier layer underneath the gate contact 335 and there is no corrugations underneath the gate contact 335. The gate contact 335 is instead surrounded by a gate insulator 450 (or a passivation layer). Therefore, in a normal state (when no bias is applied to the terminals), there is no 2DEG channel present underneath the gate contact 335. This structural difference helps to achieve a normally-off structure.

In one embodiment, the normally-off operation is obtained by having a single (block) recessed gate contact 335 depleting the channel in the gate portion (underneath the gate contact). The normally-off device of FIG. 18 can be grown on a Si substrate 305 or any other substrate available for GaN devices. Examples of these are Sapphire, Silicon Carbide, and GaN.

When a Si substrate is used, the device comprises of a buffer layer 310 on top of the substrate 305 to alleviate the lattice mismatch between the Si substrate and the III-nitride materials such as GaN. The buffer layer 310 may comprise a single layer of $Al_xGaN_{1-x}N$ (with x varying between 0 and 1) or any composition of $Al_xGaN_{1-x}N$/GaN creating a multilayer stack.

A GaN active layer 315 is grown on top of the buffer 310/substrate 305 stack with any growth technique known. Examples of these are MOCVD and MBE.

The GaN layer 315 is trenched (or corrugated) with multiple mesa trenches 380 along the x direction, except the gate portion where the gate trench is created.

A III-nitride material with a wider bandgap than the one of the active layer is grown in the GaN trenches 380 (e.g. in one example by filling the trenches completely) to form the barrier layer 325. A III-nitride material can be for example $Al_xGaN_{1-x}N$ (with any x>0).

A 2DEG channel 327 is created having portions at the horizontal (along x) and vertical (along y) directions of the barrier layer/active layer interface (AlGaN/GaN for example). The conductive channel 327 also extends towards the z-direction. The 2DEG conductive channel 327 has therefore a three-dimensional geometry. The channel has a corrugated design with extremely high surface area (for example, an increase from 2 to 5× with respect to prior art), leading to a higher conduction area and therefore significantly higher current rating capability. The increased channel density also allows smaller on-state resistance and therefore even lower losses compared to the state-of-the-art HEMT.

A gate trench in the GaN active layer is created to define the recessed gate 335. A gate insulator or passivation layer 450 is grown at the bottom and at the sidewalls of the gate trench 380. Examples of possible gate insulators are SiN and $SiO_2$ but other materials such as aluminium oxide or high dielectric materials such as Hafnium oxide or combination of insulating materials are possible. The gate insulator 450 reaches all the way to the GaN layer 315. The gate contact 335 is then formed within the gate trench on top of the gate insulator 450. Therefore, the gate contact 335 is at least partially surrounded by the gate insulator 450 on the bottom surface and along the sidewalls of the trench in the gate region. In this case, the gate contact 450 is not corrugated but it is a block of material formed by filling the trench in the gate region.

Ohmic source and drain contacts 320 are fabricated by means of any known fabrication process and they connect the multiple lateral and vertical channels along the z direction (as also shown for the FIG. 3 embodiment).

A gate contact 335 is fabricated by filling in the trenches with an insulator layer followed by a gate metal layer. This is done in order to obstruct the current flowing when zero bias is applied to the gate. The normally-off operation is obtained by completely recessing the gate metal into the GaN layer 315. The AlGaN layer or the barrier layer is therefore removed. A passivation layer or gate insulator layer 450 is grown before the gate metal 335 is deposited to guarantee the normally-off operation.

Figure 19:
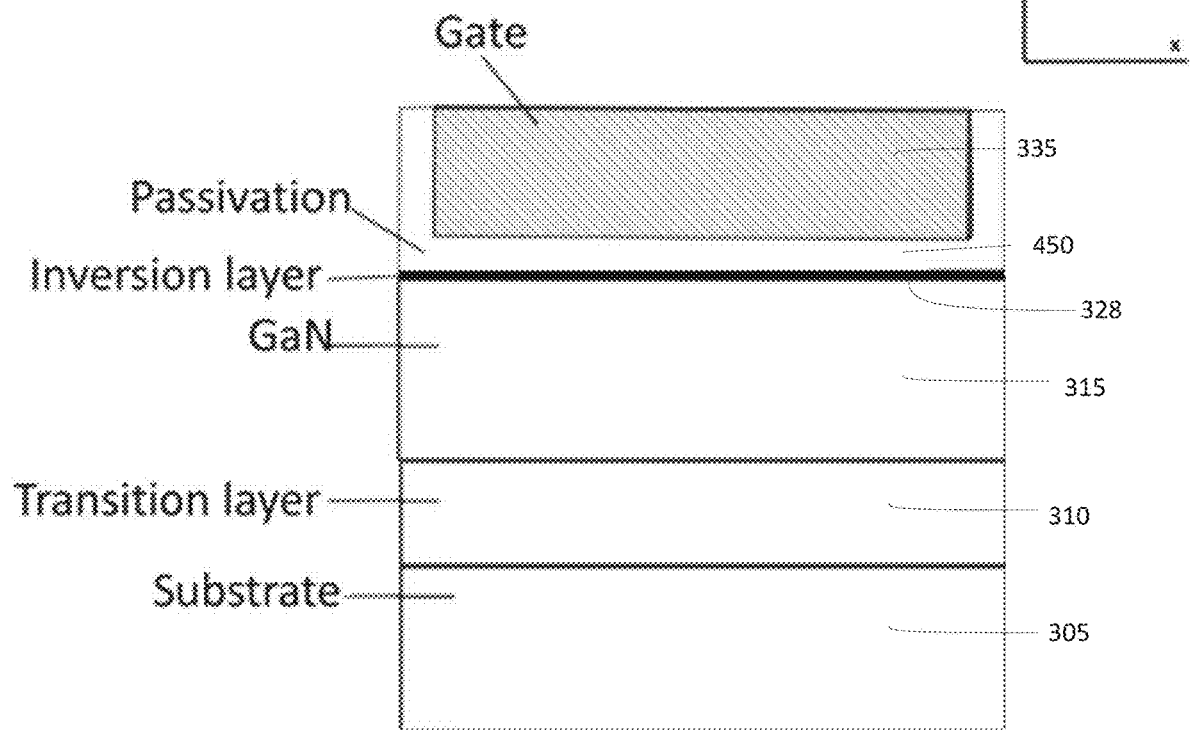
FIG. 19 illustrates a two dimensional (2D) view of the gate portion or region of the transistor of FIG. 18.

FIG. 19 illustrates a two dimensional (2D) view of the gate portion or region of the transistor of FIG. 18. The structural features of FIG. 19 are the same as those of FIG. 18 and therefore carry the same reference numbers. FIG. 19 shows that there is no AlGaN layer present underneath the gate contact 335. Instead an insulator layer or passivation layer 450 is provided underneath the gate contact 335. The gate contact 335 does not therefore form a Schottky gate in this embodiment but forms an insulated gate 335. A channel made of electrons 328, similarly to an inversion layer in a MOS structure is present under the passivation layer 450 in the GaN active layer 315. This channel 328, is controlled by that gate potential and in direct contact with the 2DEG channels 327 formed in the portion between the gate and the source and between the gate and the drain.

Figure 20:
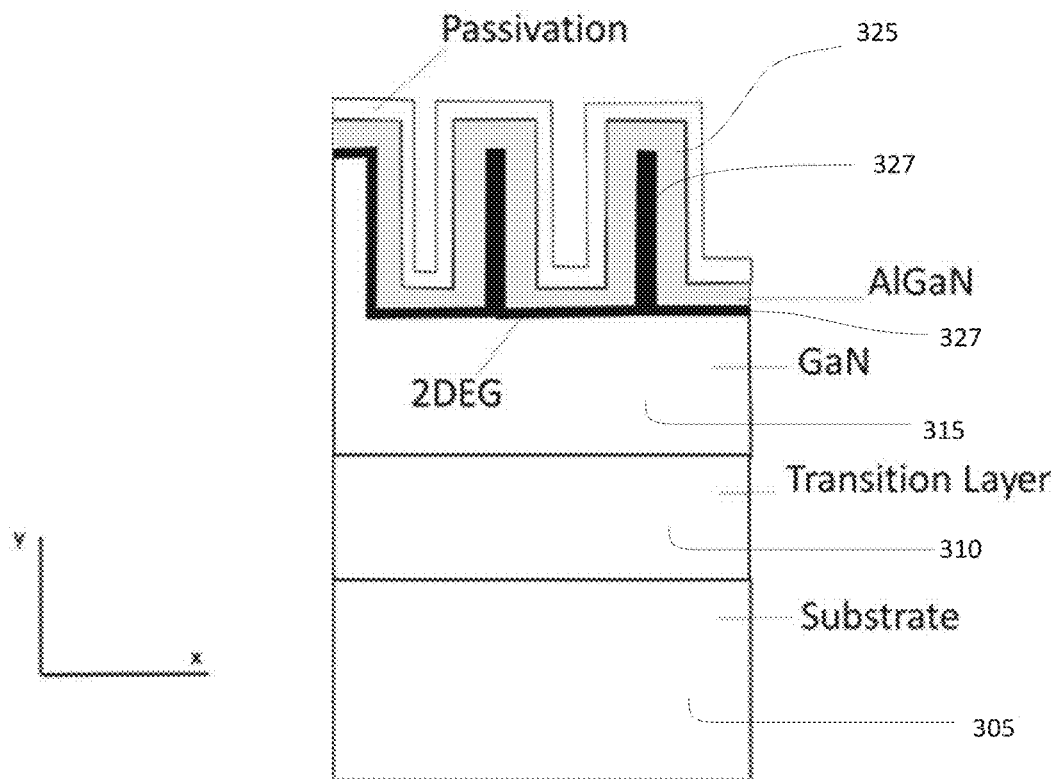
FIG. 20 illustrates a two dimensional cross-section of a drain-gate portion of an alternative transistor according to one embodiment.

FIG. 20 illustrates a two dimensional cross-section of a drain-gate portion of an alternative transistor according to one embodiment. The drain-gate portion has narrower corrugations and the 2DEG channels 327 are joined are almost joined together. This arrangement results in a 'mostly' vertical configuration of the channels 327. The very narrow body of the GaN layer 315 where the joined or almost joined channels are formed means that the level of traps in this narrow layer will be insignificant, and therefore will not affect the stability of the 2DEG layer 327. Furthermore, the 2DEG channel charge can be very high, leading to very low on-state resistance, an effect known in ultra-thin silicon on insulator devices, (SOI) or in FinFETs, where the effect of a very thin body leads to a very strong charge in the channel. Moreover, the vertical orientation of these channels will protect them from the surface traps. Furthermore, the lateral channel now can protect the vertical channels from the traps in the GaN layer 315 under the lateral channel. It will be appreciated that the drain-gate portion of FIG. 20 can be used in any of the embodiments described in relation to FIGS. 3 to 19 (e.g. for normally-on and/or normally-off transistors described above). It will be also appreciated that the narrower corrugations can be formed in the source-gate portion of the transistor and therefore the structure of FIG. 20 can also be a source-gate portion of the transistor. It will be appreciated that the term "mostly joined" refers to the 2DEG channel is very close together leaving only a very thin GaN body 315 between them.

Figure 21:
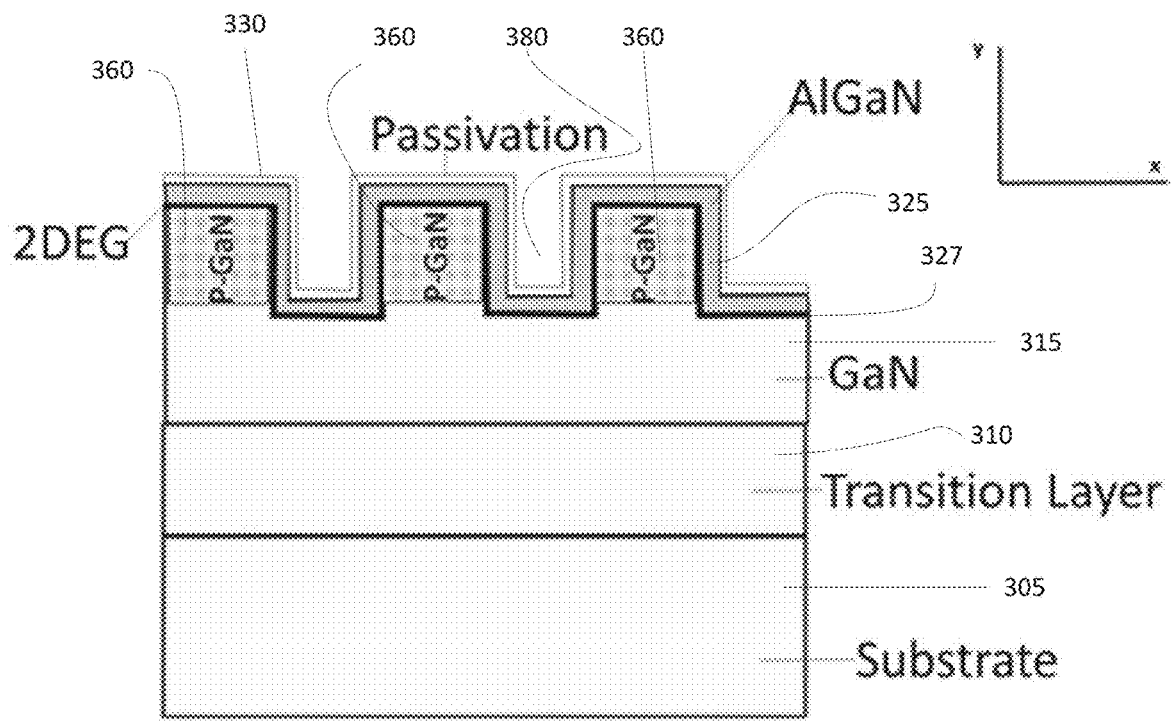
FIG. 21 illustrates an alternative corrugated region according to one embodiment.

FIG. 21 illustrates an alternative corrugated region according to one embodiment. The corrugated region includes all the features (and therefore the reference numbers) of FIG. 6 or FIG. 11, except that the GaN active layer 315 between the trenches 380 includes P-doped wells 360. The presence of the p-well doped wells 360, helps with the depletion of the 2DEG channel 327 when the device is in the off-state and blocking the voltage between the source to gate or gate to drain. The p-well doped wells 360 can help with a more favourable distribution of the electric field within the active layer (or drift region) in a blocking mode. The skilled person would recognise that the effect produced by the 2DEG planes and P-type pillars (or wells) between the trenches is similar to that of a super-junction effect. The corrugated region of FIG. 21 can form part of any one of the source-gate portion, the gate portion and the drain-gate portion of the transistor as described in any of the previous embodiments.

Figure 22:
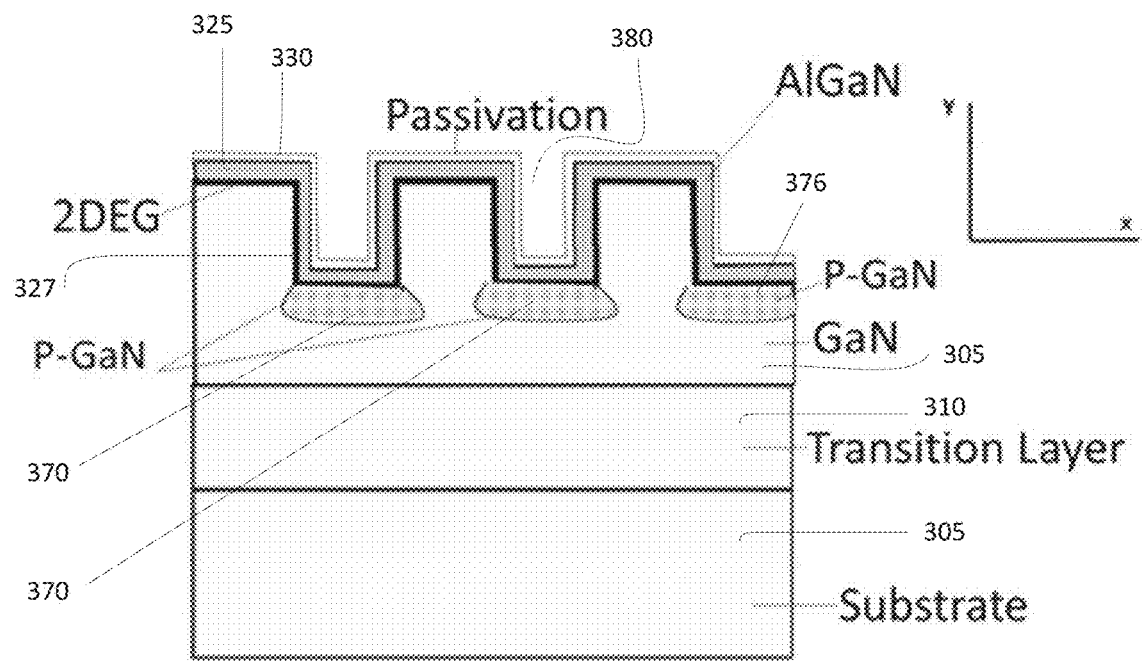
FIG. 22 illustrates an alternative corrugated region according to one embodiment.

FIG. 22 illustrates an alternative corrugated region according to one embodiment. The corrugated region includes all the features (and therefore the reference numbers) of FIG. 6 or FIG. 11, except that P-doped wells 370 are provided (directly) underneath the trenches 380. The corrugated region of FIG. 22 can form part of any one of the source-gate portion, the gate portion and the drain-gate portion of the transistor as described in any of the previous embodiments. The advantage of this embodiment is that the p-type doping can be achieved by implantation through the trenches created in the active layer 315. Furthermore, with this arrangement, the 2DEG at the bottom of the trenches can be removed if the p-doping is sufficiently high. This would eliminate any interaction between the 2DEG and the bulk traps present in the GaN layer 315.

Figure 23:
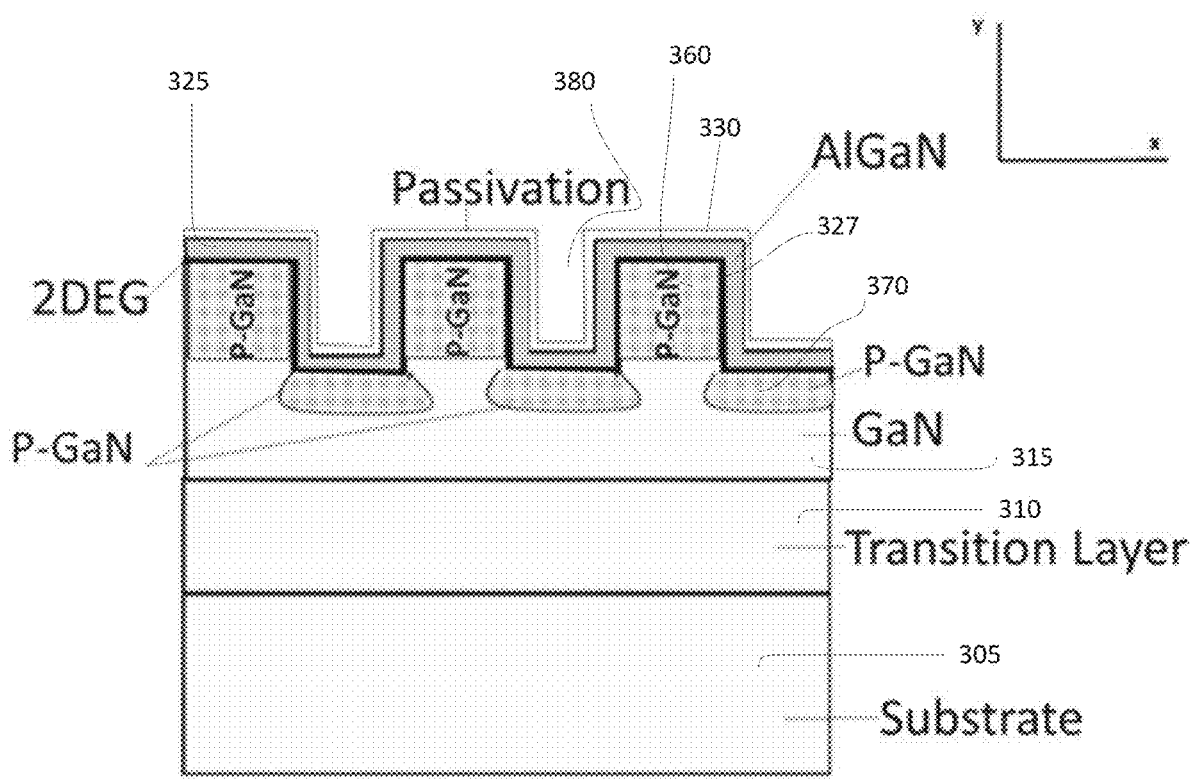
FIG. 23 illustrates an alternative corrugated region according to one embodiment.

FIG. 23 illustrates an alternative corrugated region according to one embodiment. In this example, P-doped wells 360 are placed between the trenches 380 as well as separate P-doped wells 370 are placed directly underneath the trenches 380. The corrugated region of FIG. 23 can form part of any one of the source-gate portion, the gate portion and the drain-gate portion of the transistor as described in any of the previous embodiments. This is a combination of the embodiments shown in FIG. 21 and FIG. 22. One possible advantage in manufacturing the device shown in this embodiment is that the p-wells 360 in the mesa region may be formed by epitaxial growth using the same concentration of p-type doping alongside the source to drain region while the p-wells 370 under the trenches may be implanted selectively or with different doses, under the trenches in the drift region to increase locally the total p-type charge to help with the depletion of the 2DEG layer 327 or in the gate region to adjust the threshold voltage.

Figure 24:
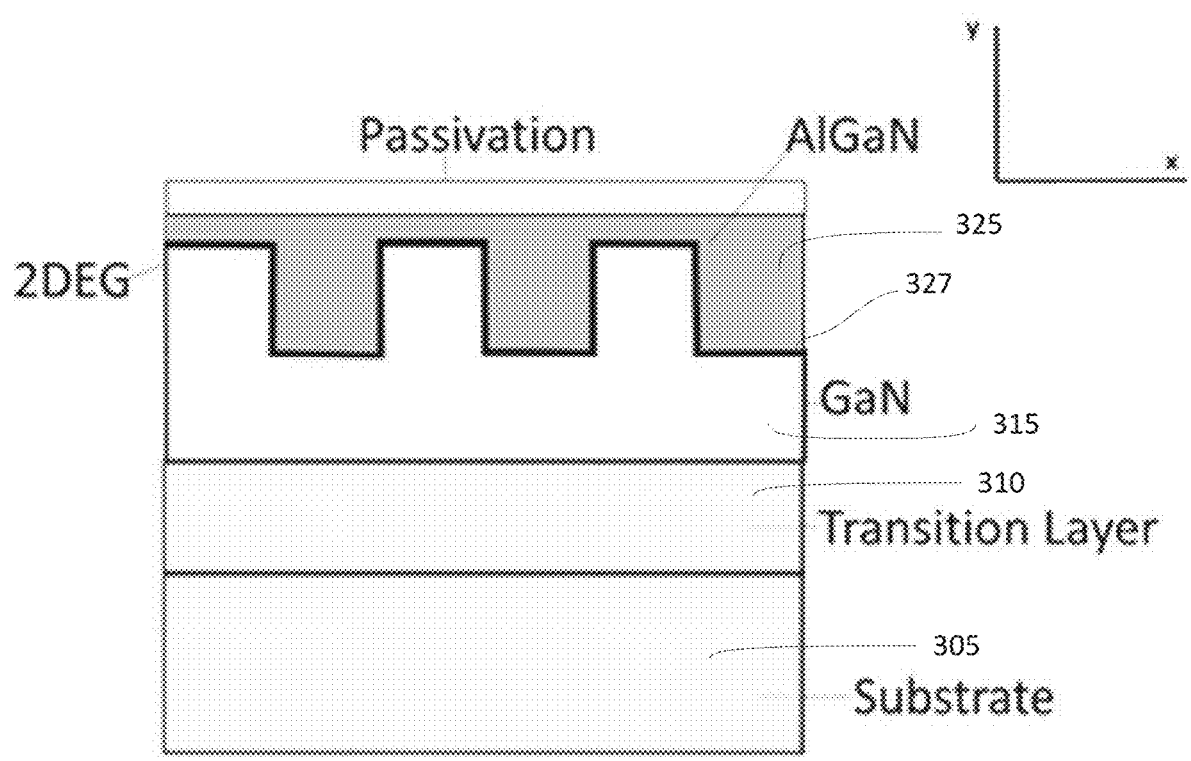
FIG. 24 illustrates an alternative corrugated region according to one embodiment.

FIG. 24 illustrates an alternative corrugated region according to one embodiment. Many features are the same as those of FIGS. 6 and 11, except that the AlGaN layer 325 is filled in the trenches 380 and is formed along the mesa regions 385. The features of FIG. 24 can be used in the structures of any of the embodiments described above.

Figure 25:
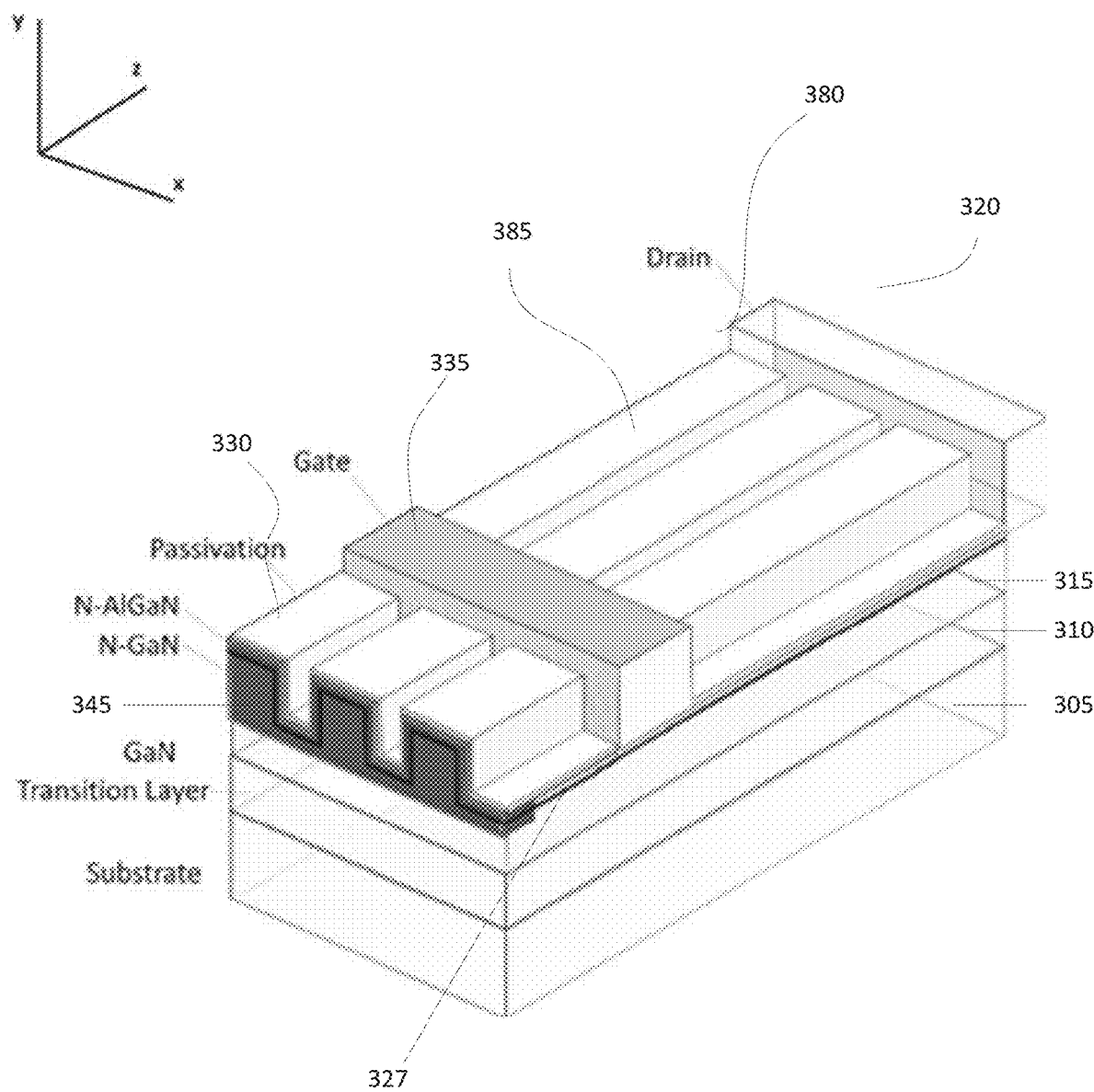
FIG. 25 illustrates a three-dimensional (3D) view of the semiconductor device in which a contact region is provided with the source contact.

FIG. 25 illustrates a three-dimensional (3D) view of the semiconductor device in which a contact region is provided with the source contact. In this embodiment, the contact region 345 is formed by implanting N-wells in the AlGaN and GaN layers next to the source contact 340. A same contact region is formed between the drain contact 320 and second portion of the device. The contact region 345 reduces contact resistance.

Figure 26:
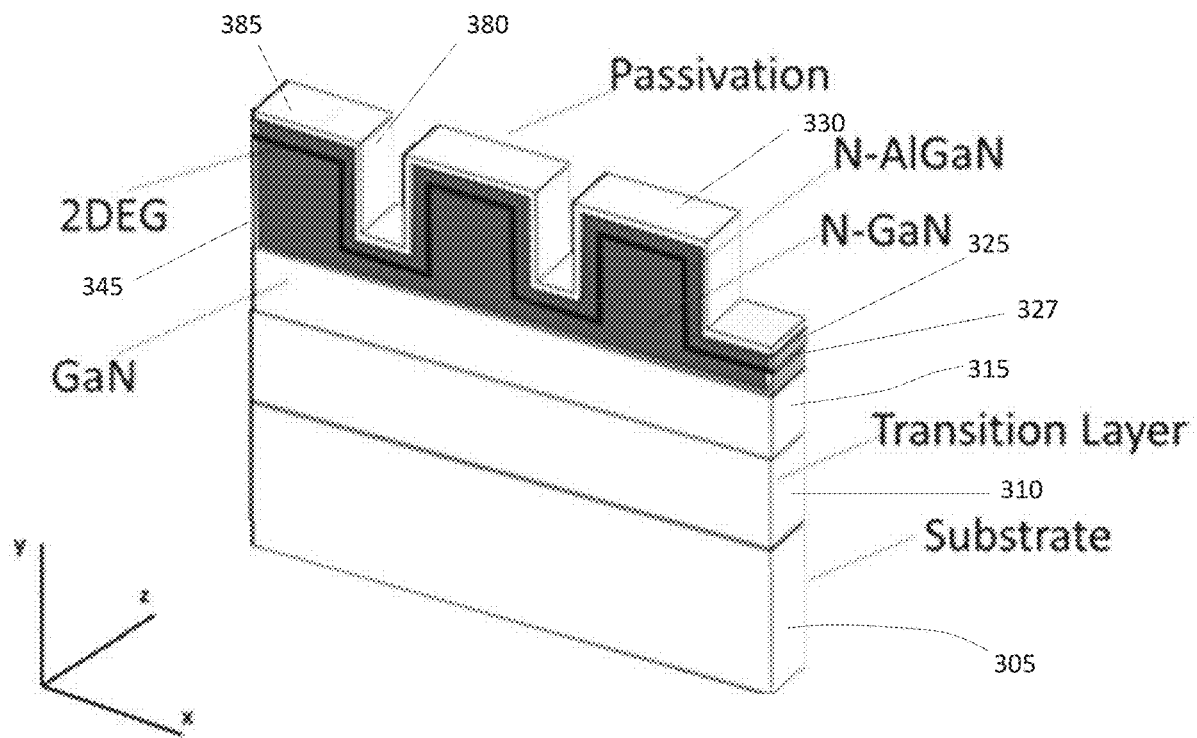
FIG. 26 illustrates a three-dimensional (3D) view of a portion of the corrugated region of the semiconductor device of FIG. 25 in which the contact region is provided with the source contact.

FIG. 26 illustrates a three-dimensional (3D) view of a portion of the corrugated region of the semiconductor device of FIG. 25 in which the contact region is provided with the source contact. Many features of FIG. 26 are the same as the FIG. 25 and therefore carry the same reference number. In this embodiment, the contact region 345 includes a very high n type doping, to form an ohmic contact with the source and metal terminals as well as to the 2DEG layer.

Figure 27:
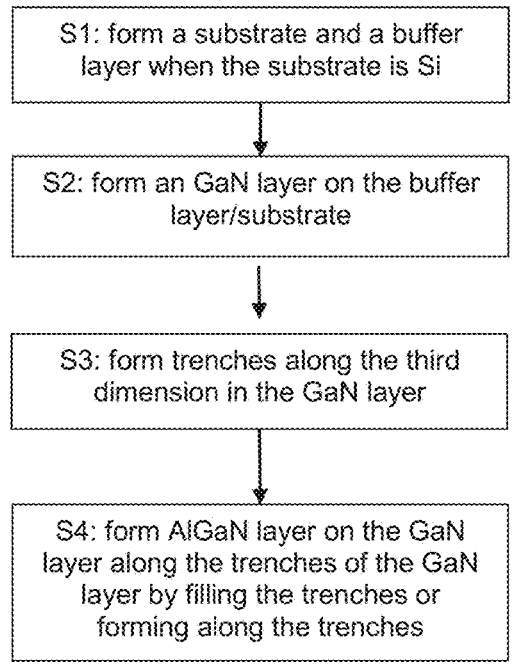
FIG. 27 illustrates a flow diagram of the manufacturing processing steps of the transistor of FIG. 3.

The manufacturing steps (S) of the transistor, for example, of FIG. 3 are described as follows. The manufacturing steps are also illustrated in FIG. 27.

S1: The manufacturing step starts by providing a substrate 305. When a Si substrate is provided, a buffer layer, or transition layer, 310 is formed on top of the substrate to alleviate the lattice mismatch between the Si substrate 305 and the III-nitride materials such as GaN. The buffer layer 310 may comprise a single layer of $Al_xGaN_{1-x}N$ (with x varying between 0 and 1) grown on a nucleation layer of aluminium nitride (AlN) or any composition of $Al_xGaN_{1-x}N$/GaN grown on a AlN layer creating a multilayer stack.

S2: A GaN active layer 315 is grown on top of the buffer 310/substrate 305 stack with any suitable growth technique known. Examples of such a growth technique are MOCVD and MBE. The GaN active layer 315 may be doped with p-type impurities, or may be partly doped with p-type impurities and the rest left unintentionally doped. The p-type doping charge may be used to help the 2DEG channel depletion during the blocking mode (off-state) of the device and reduce the off-state leakage currents S3: Trenches 380 are then formed along the x-direction (see FIG. 3) into the GaN active layer 315 using, for example, dry or wet techniques. Reactive ion etching or deep reactive ion etching can be used, but wet etching is still possible in which case the trenches may not have orthogonal shapes (the etching angle could be different from 90°). Preferably, these trenches 380 finish in the GaN active material, although it is possible that the bottom of the trench 380 can also reach the GaN buffer 310.

S4: The second III-nitride material 325 with a wider bandgap than the one of the GaN active layer is grown inside the GaN trenches at the bottom and on the sidewalls of the trenches to form the barrier layer. The second III-nitride material 325 can be for example $Al_xGaN_{1-x}N$ (with any x>0). The interface between the GaN active layer 315 and the second III-nitride material 325 formed at the bottom of the trenches and on the sidewalls is where the 2DEG channel layer 327 is present. This is known as a heterojunction. The trenches 380 can be entirely filled by the grown material (the second III-nitride material 325 with a wider bandgap or the p-type doped GaN material) or alternatively could be passivated in a conformal manner using passivation layers such as nitrides or oxides. Further p-type doping can be optionally implanted through the trenches 380, alongside the trenches 380, before or after the III-nitride material with a wider bandgap is grown on the trenches 380. The role of this p-type wells is to facilitate the formation of the depletion during the blocking mode. Alternatively, the p-type doping wells can be placed only at the bottom of the trenches to inhibit the formation of the bottom 2DEG channel or under the gate to realize a normally-off device. The p-type implant can differ in energy and dose alongside the x direction of the device (see FIG. 3 for the x-direction). For example, it can have a higher dose in the gate region compared to the region between the gate and the drain. The p-type implant can be conformal to the trenches 380 or can be mostly present at the bottom of the trenches. Alternatively the p-type doped GaN material can be grown inside the trenches. This is particularly advantageous in the gate area to realize a normally-off device, but could also be used in a similar manner to a superjunction device to help the depletion of the 2DEG channel 327 in the off-state, blocking mode and realize a more uniform electric field distribution in the drift region. The more uniform electric field distribution alongside the drift region from the gate side to the drain side is advantageous to increase the breakdown capability of the device as well as to avoid high peaks of the electric field which have been associated with poor reliability in long term operation.

Although the above description above discloses using multiple trenches in the source-gate portion (first portion) and the drain-gate portion (second portion), it will be appreciated that the device can also operate within the scope of the invention by using one trench in both the source-gate portion (first portion) and the drain-gate portion (second portion). Furthermore, the above described figures refer to 2DEG, but it will be appreciated that 2DHG can also be formed when the top III-nitride layer has a lower bandgap compared to the bottom III-nitride layer within the III-nitride region.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

Figure 28:
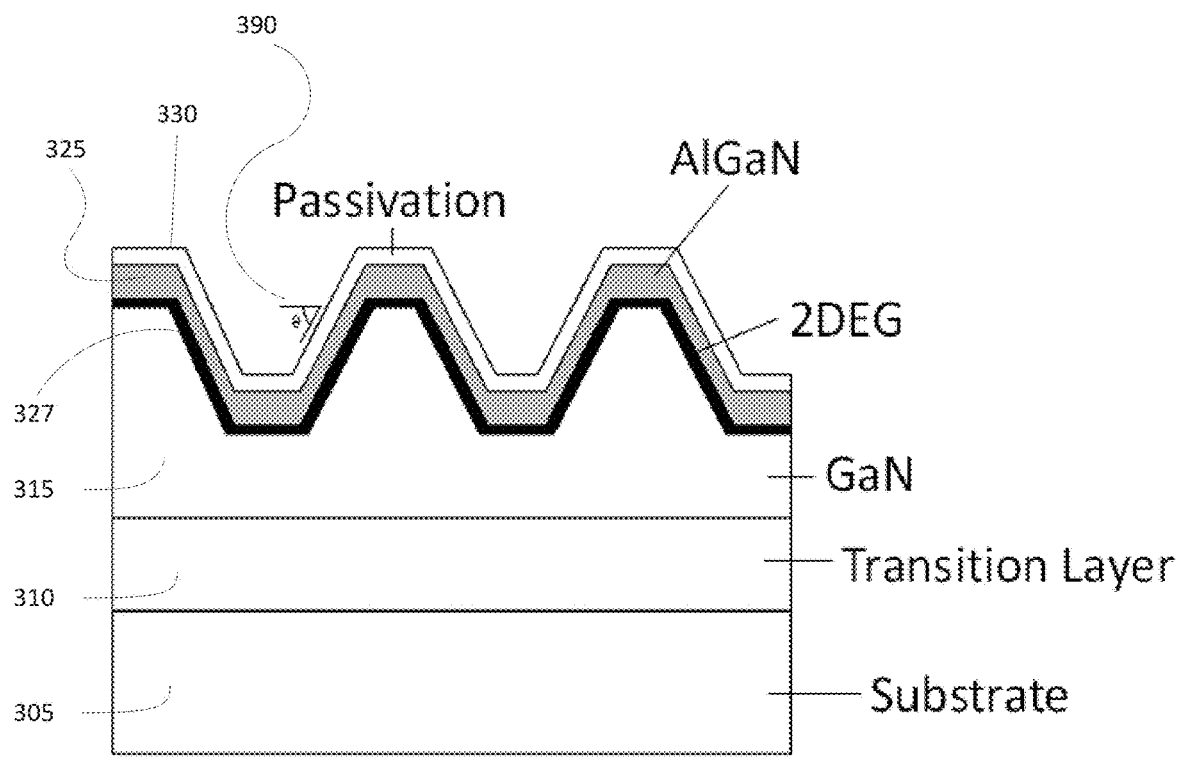
FIG. 28 illustrates a cross sectional view of the corrugated portion in an embodiment in which have walls are at an angle θ from the horizontal plane.

FIG. 28 illustrates a cross sectional view of the corrugated portion in another embodiment of the proposed invention where the trenches have walls at an angle 390 from the horizontal plane. This arrangement may lead to an increase in the magnitude of the polarization charges present at the AlGaN/GaN interface. This can lead to a two dimensional electron gas with increased carrier density compared to the vertical wall design.

Figure 29:
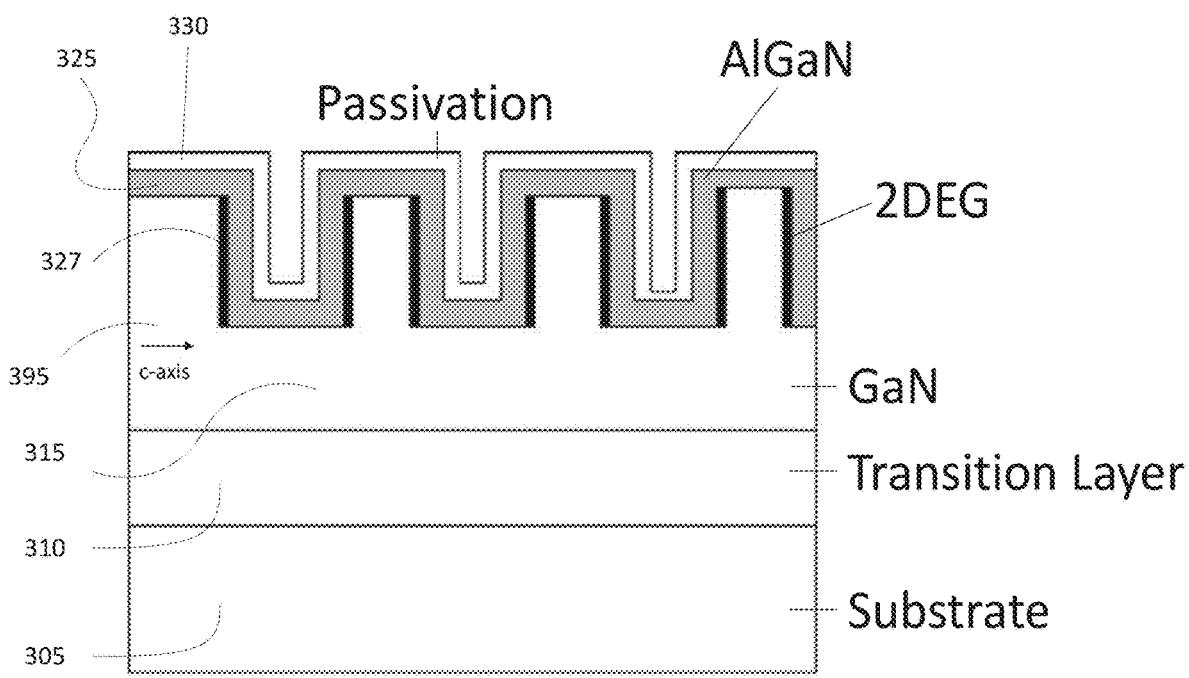
FIG. 29 illustrates a cross sectional view of the corrugated portion in an embodiment in which the growth of the GaN layer is non-polar.

FIG. 29 illustrates a cross sectional view of the corrugated portion in another embodiment of the proposed invention where the growth of the GaN layer is non-polar, that is the c-axis 395 is parallel to the layer surface (horizontal plane) such that positive polarization charges are present on the vertical walls of the trenches. By adjusting the ratio between the trench depth and the trench width, this embodiment can lead to a reduced specific on-state resistance compared to prior art. In some embodiments, increasing the trench depth to trench width ratio reduces the specific on-state resistance.

REFERENCES CITED IN THE BACKGROUND SECTION

[1] B. J. Baliga, *Power Modern Devices*: Wiley, 1987.
[2] U. K. Mishra, P. Parikh, and Y.-F. Wu, "AlGaN/GaN HEMTs-an overview of device operation and applications," in *PROCEEDINGS-IEEE* 90.6 (2002):1022-1031, 2002.
[3] Y. Cai, Zhou, Y., Chen, K. J., Lau, K. M., "High-performance enhancement-mode AlGaN/GaN HEMTs using fluoride-based plasma treatment," *IEEE Electron Device Letters*, vol. 26, pp. 435-437, 2005.
[4] W. Saito, Takada, Y., Kuraguchi, M., Tsuda, K., & Omura, I., "Recessed-gate structure approach toward normally off high-voltage AlGaN/GaN HEMT for power electronics applications," *IEEE Transactions on electron devices*, vol. 53, pp. 356-362, 2006.
[5] Y. Uemoto, Masahiro Hikita, Hiroaki Ueno, Hisayoshi Matsuo, Hidetoshi Ishida, Manabu Yanagihara, Tetsuzo Ueda, Tsuyoshi Tanaka, and Daisuke Ueda, "Gate injection transistor (GIT)—A normally-off AlGaN/GaN power transistor using conductivity modulation," *IEEE Transactions on Electron Devices*, vol. 54, pp. 3393-3399, 2007.
[6] T. Oka, and Tomohiro Nozawa, "AlGaN/GaN recessed MIS-gate HFET with high-threshold-voltage normally-off operation for power electronics applications," *IEEE Electron Device Letters* vol. 29, pp. 668-670, 2008.
[7] S. Yang, Shenghou Liu, Cheng Liu, Mengyuan Hua, and Kevin J. Chen., "Gate stack engineering for GaN lateral power transistors" *Semiconductor Science and Technology* vol. 31, p. 024001, 2015.
[8] H. Ohta, and Hidemi Takasu, "Semiconductor device employing group III-V nitride semiconductors and method for manufacturing the same," U.S. Pat. No. 8,044,434, 2011.
[9] R. Beach, and Paul Bridger, "III-nitride semiconductor device with trench structure," U.S. Pat. No. 7,439,555, 2008.
[10] P. Moens, Vanmeerbeek, P., Banerjee, A., Guo, J., Liu, C., Coppens, P., Salih, A., Tack, M., Caesar, M., Uren, M. J. and Kuball, M., "On the impact of carbon-doping on the dynamic Ron and off-state leakage current of 650V GaN power devices," in *27th International Symposium on Power Semiconductor Devices & IC's (ISPSD)*, Hong Kong, 2015, pp. 37-40.
[11] W. Saito, Noda, T., Kuraguchi, M., Takada, Y., Tsuda, K., Saito, Y., Omura, I. and Yamaguchi, M. i, "Effect of buffer layer structure on drain leakage current and current collapse phenomena in high-voltage GaN-HEMTs." *IEEE Transactions on Electron Devices*, vol. 56, pp. 1371-1376, 2009.
[12] N. Okamoto, and Atsushi Yamada, "Semiconductor device and method for manufacturing the same, and amplifier," U.S. Pat. No. 8,704,273, 2014.
[13] K. Ohi, and Tamotsu Hashizume, "Drain current stability and controllability of threshold voltage and sub-threshold current in a multi-mesa-channel AlGaN/GaN high electron mobility transistor," *Japanese Journal of Applied Physics*, vol. 48, p. 08100, 2009.

[14] B. Lu, Elison Matioli, and Tomás Palacios, "Tri-gate normally-off GaN power MISFET," *IEEE Electron Device Letters* vol. 33, pp. 360-362, 2012.

What is claimed is:

1. A III-nitride semiconductor based heterojunction power device, comprising:
    a substrate;
    a III-nitride semiconductor region formed over the substrate;
    a source operatively connected to the III-nitride semiconductor region;
    a drain laterally spaced from the source and operatively connected to the III-nitride semiconductor region;
    a gate formed over the III-nitride semiconductor region, the gate being formed between the source and drain;
    wherein the III-nitride semiconductor region comprises:
        a first portion formed between the source and gate, wherein the source is in contact with the first portion, wherein the first portion comprises a heterojunction;
        a second portion formed between the gate and drain, wherein the drain is in contact with the second portion, wherein the second portion comprises said heterojunction;
    wherein the heterojunction of the first portion and the second portion of the III-nitride semiconductor region further comprises:
        a first III-nitride semiconductor layer having a first band gap formed over the substrate;
        a second III-nitride semiconductor layer having a second bandgap different from the first band gap disposed on the first III-nitride semiconductor layer; and
        a two dimensional carrier gas formed between the first and second III-nitride semiconductor layers to provide a channel;
    wherein the III-nitride semiconductor region further comprises:
        at least one trench having sidewalls and being formed only within the III-nitride semiconductor region;
        mesa regions each extending away from each sidewall of the at least one trench;
    wherein said two dimensional carrier gas is located alongside the mesa regions and alongside the at least one trench;
    wherein at least one of the source and drain which is respectively in contact with the at least one of the first and second portions is in contact with said two dimensional carrier gas located alongside said at least one trench and alongside the mesa regions of the at least one of the first and second portions of the III-nitride semiconductor region; and
    wherein the first III-nitride semiconductor layer of the second portion comprises said at least one trench and mesa regions, and wherein the first III-nitride semiconductor layer of the first portion does not comprise said at least one trench and mesa regions.

2. A heterojunction power device according to claim 1, wherein either:
    (i) said sidewalls are at an angle from the horizontal plane of less than 90°; or
    (ii) the angle from the horizontal plane is about 90° such that the sidewalls are substantially vertical.

3. A heterojunction power device according to claim 2, wherein the two dimensional carrier gas alongside said at least one trench and mesa regions extends in a folded three dimensional area of the device.

4. A heterojunction power device according to claim 1, wherein either:
    (i) wherein the second III-nitride semiconductor layer is disposed along the vertical sidewalls of the at least one trench and the mesa region; or
    (ii) wherein the second III-nitride semiconductor layer is disposed by filling the at least one trench and along the mesa region.

5. A heterojunction power device according to claim 4, wherein the at least one trench comprises a bottom surface between the vertical sidewalls, and the second III-nitride semiconductor layer is disposed on the bottom surface of the at least one trench;
    optionally wherein the channel is formed along the vertical sidewalls and the bottom surface of the at least one trench and along the mesa regions;
    optionally wherein the channel comprises vertical portions along the vertical sidewalls and lateral portions along the bottom surface and along the mesa regions within the heterojunction;
    optionally wherein the vertical sidewalls of the at least one trench are closed to one another so that the channel formed along the vertical sidewalls are joined together; and
    optionally wherein the joined channel comprises a vertical portion along the vertical sidewalls and lateral portions along the mesa regions.

6. A heterojunction power device according to claim 3, wherein:
    the source comprises a source terminal which is in direct contact with the channel in the first portion of the III-nitride semiconductor region.

7. A heterojunction power device according to claim 3, wherein:
    the drain comprises a drain terminal which is in direct contact with the channel in the second portion of the III-nitride semiconductor region.

8. A heterojunction power device according to claim 3, wherein the III-nitride semiconductor region further comprises a third portion underneath the gate, the third portion being positioned between the first and second portions of the III-nitride semiconductor region; and
    optionally wherein the third portion of the III-nitride semiconductor region comprises:
        the first III-nitride semiconductor layer over the substrate;
        the second III-nitride semiconductor layer disposed on the first III-nitride semiconductor layer; and
        the two dimensional carrier gas formed between the first and second III-nitride semiconductor layers to provide the channel within the heterojunction in the third portion of the III-nitride semiconductor region.

9. A heterojunction power device according to claim 8, wherein:
    the first III-nitride semiconductor layer comprises said at least one trench and mesa regions, and wherein said second III-nitride semiconductor layer is disposed along the vertical sidewalls and the bottom surface of the at least one trench and along the mesa region;
    optionally wherein the channel is formed at least along the vertical sidewalls and the bottom surface of the trench and along the mesa regions;
    optionally wherein the channel comprises vertical portions along the vertical sidewalls and lateral portions along the bottom surface and the mesa regions; and optionally wherein the gate is formed directly on the second III-nitride semiconductor layer and along the vertical sidewalls and the bottom surface of the at least one trench and along the mesa regions.

10. A heterojunction power device according to claim 3, wherein the source, drain and gate are configured such that, in an on-state operation, current flows through the channel between the drain and source at least along the sidewalls of the at least one trench and along the mesa regions.

11. A heterojunction power device according to claim 3, wherein at least one of:
(i) the first III-nitride semiconductor layer comprises a material comprising gallium nitride (GaN), optionally wherein the growth of the GaN layer is non-polar such that c-axis is parallel to the horizontal plane and positive polarization charges are present on the vertical sidewalls; and
(ii) the second III-nitride semiconductor layer comprises a material comprising aluminium gallium nitride (AlGaN) or aluminium nitride (AlN).

12. A heterojunction power device according to claim 11, further comprising aluminium nitride (AlN) between the GaN layer and the AlGaN layer.

13. A heterojunction power device according to claim 3, wherein:
the first III-nitride semiconductor layer comprises p-doped gallium nitride wells underneath the mesa regions and a p-doped gallium nitride well underneath the at least one trench;
and
optionally wherein the p-doped gallium nitride wells underneath the gate have a higher dose compared to those of the p-doped gallium nitride wells in the first and second portions of the III-nitride semiconductor region.

14. A heterojunction power device according to claim 1, further comprising a buffer layer between the III-nitride semiconductor region and the substrate, wherein the substrate is a silicon substrate, and optionally wherein either:
(i) the buffer layer comprises a single layer of aluminium gallium nitride (AlGaN) or aluminium nitride (AlN); or
(ii) the buffer layer comprises a multilayer stack comprising a composition of aluminium gallium nitride (AlGaN) with varying aluminium concentration and gallium nitride (GaN).

15. A heterojunction power device according to claim 1, further comprising a passivation layer formed on the III-nitride semiconductor region along the at least one trench and on the mesa regions.

16. A heterojunction power device according to claim 3, wherein:
the first bandgap of the first III-nitride semiconductor layer is lower compared to the second bandgap of the second III-nitride semiconductor layer, and wherein the two dimensional carrier gas formed between the first and second III-nitride semiconductor layer comprises a two dimensional electron gas.

* * * * *